(12) United States Patent
Takeda et al.

(10) Patent No.: US 9,337,015 B2
(45) Date of Patent: May 10, 2016

(54) METHOD OF MANUFACTURING A SEMICONDUCTOR DEVICE, METHOD OF PROCESSING A SUBSTRATE, SUBSTRATE PROCESSING APPARATUS, AND RECORDING MEDIUM

(71) Applicant: HITACHI KOKUSAI ELECTRIC INC., Tokyo (JP)

(72) Inventors: Tsuyoshi Takeda, Toyama (JP); Taketoshi Sato, Toyama (JP); Minoru Kohashi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 26 days.

(21) Appl. No.: 13/853,058

(22) Filed: Mar. 29, 2013

(65) Prior Publication Data

US 2013/0280921 A1    Oct. 24, 2013

(30) Foreign Application Priority Data

Apr. 20, 2012    (JP) ................................ 2012-096929
Mar. 18, 2013    (JP) ................................ 2013-054706

(51) Int. Cl.

| | |
|---|---|
| H01L 21/31 | (2006.01) |
| H01L 21/02 | (2006.01) |
| C23C 16/26 | (2006.01) |
| C23C 16/44 | (2006.01) |
| C23C 16/455 | (2006.01) |

(52) U.S. Cl.
CPC .......... H01L 21/02115 (2013.01); C23C 16/26 (2013.01); C23C 16/4412 (2013.01); C23C 16/45523 (2013.01); H01L 21/0228 (2013.01)

(58) Field of Classification Search
CPC ...................... H01L 21/02115; H01L 21/0228

USPC .................................. 438/758, 780, 781, 789
See application file for complete search history.

(56) References Cited

U.S. PATENT DOCUMENTS

| | | | |
|---|---|---|---|
| 4,797,338 A | * | 1/1989 | Iino et al. ...................... 430/58.1 |
| 2008/0213479 A1 | * | 9/2008 | Chou et al. ............. 427/255.393 |
| 2009/0029562 A1 | | 1/2009 | Okada et al. |
| 2009/0093128 A1 | | 4/2009 | Seamons et al. |
| 2009/0191722 A1 | * | 7/2009 | Hasebe et al. ................ 438/792 |
| 2010/0221925 A1 | * | 9/2010 | Lee et al. ....................... 438/792 |
| 2011/0195580 A1 | | 8/2011 | Okada et al. |

FOREIGN PATENT DOCUMENTS

| | | |
|---|---|---|
| JP | 4-291721 A | 10/1992 |
| JP | 2001-358137 A | 12/2001 |
| JP | 3429171 | 7/2003 |
| JP | 2009-032766 A | 2/2009 |
| JP | 2009-135439 A | 6/2009 |
| JP | 2011-181903 A | 9/2011 |

OTHER PUBLICATIONS

Korean office action dated May 19, 2014 that was issued in a Korean patent application corresponding to the instant patent application.

* cited by examiner

*Primary Examiner* — Brook Kebede
(74) *Attorney, Agent, or Firm* — Solaris Intellectual Property Group, PLLC

(57) ABSTRACT

Disclosed is a method of manufacturing a semiconductor device. The method includes forming a film containing carbon on a substrate by repeating a cycle plural times. The cycle includes: in a state in which a substrate housed in a processing chamber is heated, supplying an organic-based gas into the processing chamber and confining the organic-based gas inside the processing chamber; maintaining a state in which the organic-based gas is confined inside the processing chamber; and exhausting an inside of the processing chamber.

15 Claims, 14 Drawing Sheets

METHOD OF MANUFACTURING A SEMICONDUCTOR DEVICE, METHOD OF PROCESSING A SUBSTRATE, SUBSTRATE PROCESSING APPARATUS, AND RECORDING MEDIUM

CROSS-REFERENCE TO RELATED APPLICATION

This application claims priority under 35 USC 119 from Japanese Patent Application No. 2012-096929 filed on Apr. 20, 2012 and Japanese Patent Application No. 2013-054706 filed on Mar. 18, 2013, the disclosures of which are incorporated by reference herein.

BACKGROUND

The present invention relates to a method of manufacturing a semiconductor device, a method of processing a substrate, a substrate processing apparatus and a recording medium, and in particular to a method of manufacturing a semiconductor device and a method of processing a substrate each including a process of film-forming a carbon-based film, a substrate processing apparatus appropriate to applying such processing and a recording medium.

Carbon-based films such as carbon films have extremely high resistance to etching with HF-based and CF-based substances. On the other hand, such films are very readily removed using for example activated oxygen, and can therefore be applied as hard masks or sacrificial films for double patterning in lithography processes. Moreover, such films can be applied as stacking-layer materials combined with metals or as compound materials for electrode processes or wiring line processes.

Recently, demand for miniaturization and higher performance in semiconductor devices is on the increase. Lower temperature manufacturing technology for semiconductor devices is demanded in order to meet such demands. Accompanying this trend is a demand for lower film-forming temperatures for carbon-based films.

However, it has been difficult to obtain a carbon-based film that has appropriate characteristics when the temperature for film-forming is brought down from a high temperature region of above 700° C. to intermediate or low temperature regions of 700° C. or below.

SUMMARY

Accordingly, a main object of the present invention is to provide a method of manufacturing a semiconductor device and a method of processing a substrate that enable a carbon-based film to be formed with appropriate characteristics in a temperature region of 700° C. or below, a substrate processing apparatus, and a recording medium.

According to an aspect of the present invention, there is provided a method of manufacturing a semiconductor device including:

forming a film containing carbon on a substrate by repeating a cycle plural times, wherein the cycle includes:
  in a state in which a substrate housed in a processing chamber is heated, supplying an organic-based gas into the processing chamber and confining the organic-based gas inside the processing chamber;
  maintaining a state in which the organic-based gas is confined inside the processing chamber; and
  exhausting an inside of the processing chamber.

According to another aspect of the present invention, there is provided a method of processing a substrate including:

forming a film containing carbon on a substrate by repeating a cycle plural times, wherein the cycle includes:
  in a state in which a substrate housed in a processing chamber is heated, supplying an organic-based gas into the processing chamber and confining the organic-based gas inside the processing chamber;
  maintaining a state in which the organic-based gas is confined inside the processing chamber; and
  exhausting an inside of the processing chamber.

According to still another aspect of the present invention, there is provided a substrate processing apparatus comprising:

a processing chamber configured to house a substrate;
a heater configured to heat the substrate inside the processing chamber;
an organic-based gas supply system configured to supply an organic-based gas into the processing chamber;
an exhaust system configured to exhaust an inside of the processing chamber; and
a controller configured to control the heater, the organic-based gas supply system and the exhaust system such that a film containing carbon is formed on the substrate by repeating a cycle plural times, the cycle including: in a state in which the substrate housed in the processing chamber is heated, supplying an organic-based gas into the processing chamber and confining the organic-based gas inside the processing chamber, maintaining a state in which the organic-based gas is confined inside the processing chamber, and exhausting the inside of the processing chamber.

According to still another aspect of the present invention, there is provided a non-transitory computer-readable recording medium storing a program that causes a computer to perform a process including: forming a film containing carbon on a substrate by repeating a cycle plural times, wherein the cycle includes:

in a state in which a substrate housed in a processing chamber is heated, supplying an organic-based gas into the processing chamber and confining the organic-based gas inside the processing chamber;
maintaining a state in which the organic-based gas is confined inside the processing chamber, and
exhausting an inside of the processing chamber.

BRIEF DESCRIPTION OF THE DRAWINGS

Exemplary embodiments of the present invention will be described in detail based on the following figures, wherein.

DETAILED DESCRIPTION

Explanation follows regarding preferable exemplary embodiments of the present invention.

The present inventors, as a result of diligent research into film-forming of carbon-based films, such as amorphous carbon films, using organic-based gases at the medium and low temperature regions, have discovered that carbon-based films can be formed in a non-plasma state even at the medium and low temperature regions by employing a gas containing carbon, namely an organic-based gas, and a hydrogen-containing gas. Namely, the present inventors have discovered that even at the medium and low temperature regions, it is possible to initiate appropriate reactions in a gas phase or on a substrate by thermally decomposing an organic-based gas to achieve an activated state, thereby enabling film-forming of carbon-based films possessing appropriate characteristics. Preferable exemplary embodiments of the present invention are based on this knowledge discovered by the present inventors.

Note that in the present specification, the term carbon-based film (sometimes also referred to below as carbon-based thin film or carbon-based film) means a film containing at least carbon (C), and includes: non-crystalline carbon films, namely amorphous carbon films (a-C films); polycrystalline carbon films containing a large number of minute crystals such as graphite, namely poly-carbon films (p-C films); and diamond-like carbon films (DLC films) containing a large degree of diamond crystal-like characteristics. It also includes films containing other elements, such as a silicon carbide film (SiC film), a silicon carbonitride film (SiCN film), a boron carbide film (BC film), a boron carbonitride film (BCN film), an aluminum carbide film (AlC film), an aluminum carbonitride film (AlCN film), an aluminum silicon carbide film (AlSiC film), a titanium carbide film (TiC film), a titanium carbonitride film (TiCN film), a tantalum carbide film (TaC film), a tantalum carbonitride film (TaCN film), a molybdenum carbide film (MoC film), a molybdenum carbonitride film (MoCN film), a tungsten carbide film (WC film) and a tungsten carbonitride film (WCN film).

Detailed explanation follows regarding a preferable exemplary embodiment of the present invention, with reference to the drawings.

Figure 1:
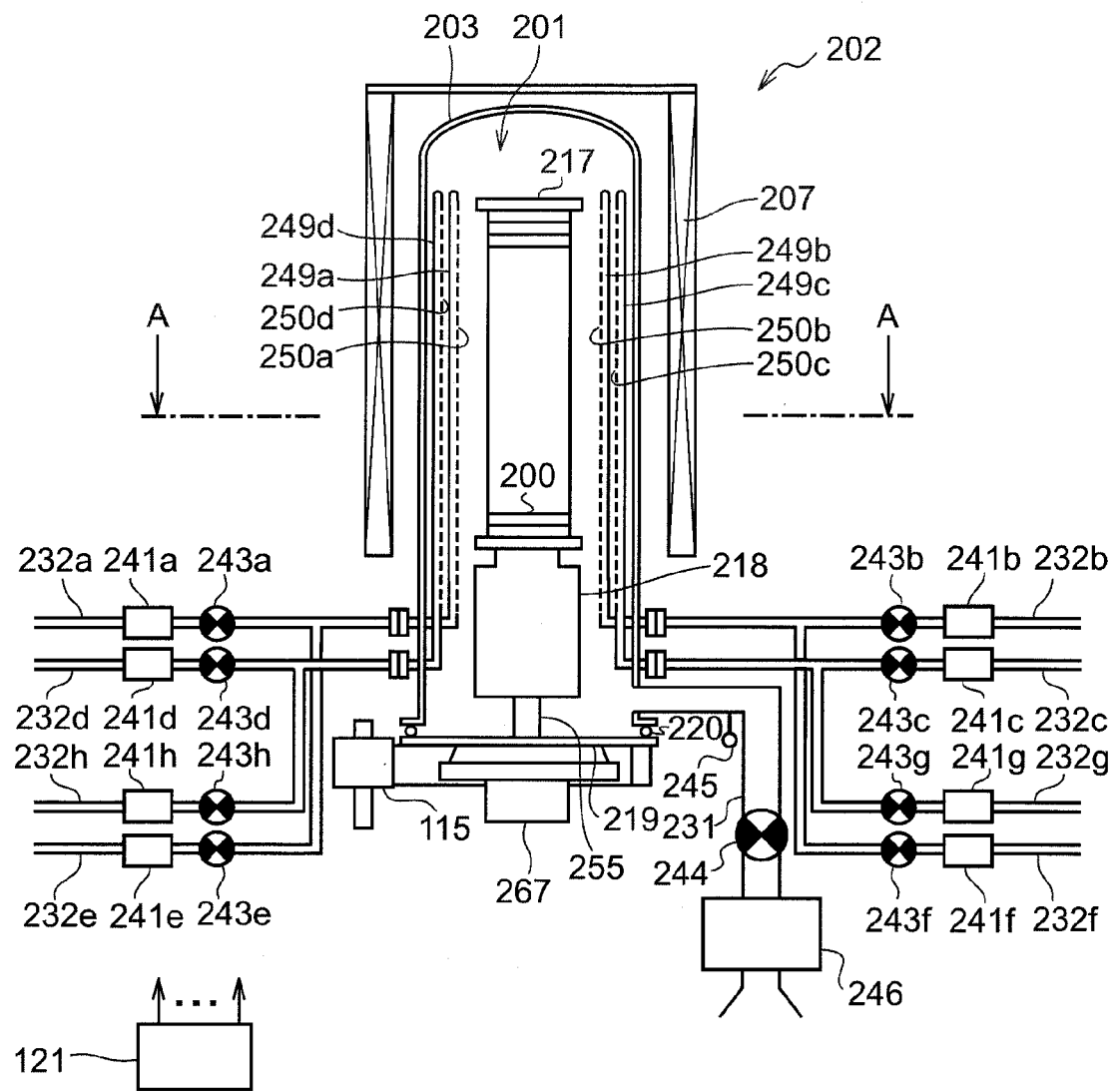
FIG. 1 is a schematic configuration diagram of a vertical processing furnace of a substrate processing apparatus preferably employed in an exemplary embodiment of the present invention, showing processing furnace portions in vertical cross-section.
Figure 2:
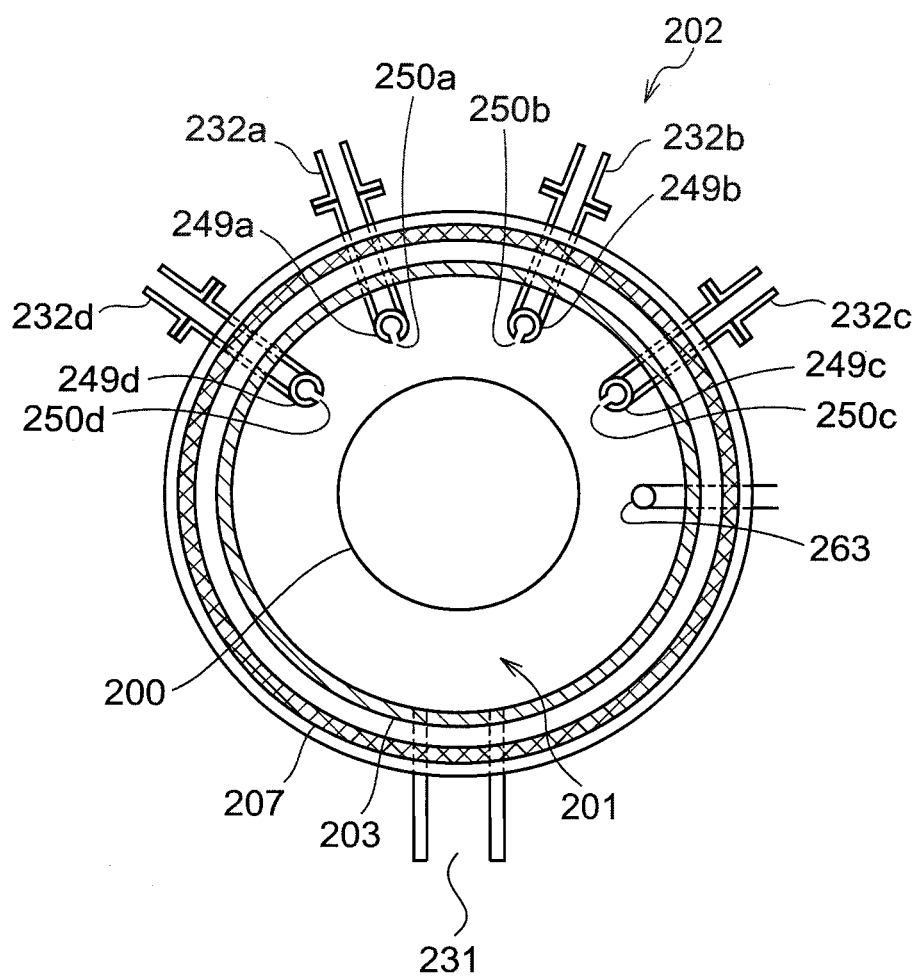
FIG. 2 is a schematic configuration diagram of a vertical processing furnace of a substrate processing apparatus preferably employed in an exemplary embodiment of the present invention, showing processing furnace portions in a cross-section taken along line A-A in FIG. 1.

FIG. 1 is a schematic configuration diagram for explaining a vertical processing furnace of a substrate processing apparatus appropriately employed in preferable exemplary embodiments of the present invention, with a portion of a processing furnace 202 illustrated in vertical cross-section. FIG. 2 is a schematic configuration diagram for explaining a vertical processing furnace appropriately employed in preferable exemplary embodiments of the present invention, with a portion of the processing furnace 202 illustrated in a transverse cross-section taken on line A-A of FIG. 1.

As illustrated in FIG. 1, the processing furnace 202 includes a heater 207 as a heating means (heating mechanism). The heater 207 has a circular cylindrical shape, and is aligned vertically supported by a heater base (not shown in the drawings) that serves as a holding plate. Note that the heater 207 also has a function as an activation mechanism to thermally decompose and activate a gas as described later.

A reaction tube 203 configuring a reaction vessel (processing vessel) that is circular in shape and coaxial to the heater 207 is disposed inside the heater 207. The reaction tube 203 is made from a heat resistant material such as for example quartz ($SiO_2$) or silicon carbide (SiC), and is formed in a circular cylindrical shape with closed upper end and open bottom end. A processing chamber 201 is formed within a hollow tube portion of the reaction tube 203, in a configuration such that wafers 200 serving as substrates are capable of being accommodated in a horizontal orientation by a boat 217 along the vertical direction in a multi-layer stacked state.

A first nozzle 249a, a second nozzle 249b, a third nozzle 249c and a fourth nozzle 249d are disposed inside the processing chamber 201, with each provided so as to respectively pass through a lower portion of the reaction tube 203. A first gas supply pipe 232a, a second gas supply pipe 232b, a third gas supply pipe 232c and a fourth gas supply pipe 232d are respectively connected to the first nozzle 249a, the second nozzle 249b, the third nozzle 249c and the fourth nozzle 249d. There are accordingly four nozzles 249a, 249b, 249c, 249d and four gas supply pipes 232a, 232b, 232c, 232d provided in the reaction tube 203, in a configuration such that plural types of gas, four types of gas in this case, can be supplied into the processing chamber 201. Note that a manifold made from metal may be provided below the reaction tube 203 to support the reaction tube 203, and each of the nozzles may be provided so as to pass through side walls of the metal manifold. In such a case, an exhaust pipe 231, described later, may also be provided to the metal manifold. Note that in such a case the exhaust pipe 231 may still be provided to a lower portion of the reaction tube 203, rather than to the metal manifold. The furnace opening portion of the processing furnace may be made from metal, and nozzles and the like may be attached to the metal furnace opening portion of the processing furnace.

A mass flow controller (MFC) 241a that is a flow rate controller (flow rate control unit) and an open-close valve 243a are provided to the first gas supply pipe 232a in sequence from the upstream side. A first inert gas supply pipe 232e is connected further to the downstream side than the valve 243a of the first gas supply pipe 232a. A mass flow controller 241e that is a flow rate controller (flow rate control unit) and an open-close valve 243e are provided to the first inert gas supply pipe 232e in sequence from the upstream side. The first nozzle 249a described above is connected to the leading end portion of the first gas supply pipe 232a. The first nozzle 249a is provided in a circular arc shaped space between an inner wall of the reaction tube 203 and the wafers 200 so as to extend upright along the inner wall of the reaction tube 203 from a lower portion thereof to an upper portion thereof, extending upward in the stacking direction of the wafers 200. Namely, the first nozzle 249a is provided at the side of a wafer placement region where the wafers 200 are disposed, so as to run along the wafer placement region in a region that horizontally surrounds the wafer placement region. The first nozzle 249a is configured as an L-shaped long nozzle provided such that a horizontal portion of the first nozzle 249a passes through a lower portion of the side wall of the reaction tube 203, and a vertical portion of the first nozzle 249a is provided so as to extend upright from at least one end side of the wafer placement region toward the other end side of the wafer placement region. Gas supply holes 250a that supply gas are provided in a side face of the first nozzle 249a, enabling gas to be supplied towards the wafers 200. The gas supply holes 250a are opened so as to face towards the center of the reaction tube 203. Plural of the gas supply holes 250a are provided spanning from a lower portion to an upper portion of the reaction tube 203, with each having the same opening area, and moreover each provided at the same opening pitch. A first gas supply system is configured mainly by the first gas supply pipe 232a, the mass flow controller 241a, the valve 243a and the first nozzle 249a. A first inert gas supply system is mainly configured by the first inert gas supply pipe 232e, the mass flow controller 241e and the valve 243e.

A mass flow controller (MFC) 241b that is a flow rate controller (flow rate control unit) and an open-close valve 243b are provided to the second gas supply pipe 232b in sequence from the upstream side. A second inert gas supply pipe 232f is connected further to the downstream side than the valve 243b of the second gas supply pipe 232b. A mass flow controller 241f that is a flow rate controller (flow rate control unit) and an open-close valve 243f are provided to the second inert gas supply pipe 232f in sequence from the upstream side. The second nozzle 249b described above is connected to the leading end portion of the second gas supply pipe 232b. The second nozzle 249b is provided in a circular arc shaped space between an inner wall of the reaction tube 203 and the wafers 200 so as to extend upright along the inner wall of the reaction tube 203 from a lower portion thereof to an upper portion thereof, extending upward in the stacking direction of the wafers 200. Namely, the second nozzle 249b is provided at the side of a wafer placement region where the wafers 200 are disposed, so as to run along the wafer placement region in a region that horizontally surrounds the wafer placement region. The second nozzle 249b is configured as an L-shaped long nozzle provided such that a horizontal portion of the second nozzle 249b passes through a lower portion of the side wall of the reaction tube 203, and a vertical portion of the second nozzle 249b is provided so as to extend upright from at least one end side of the wafer placement region towards the other end side of the wafer placement region. Gas supply holes 250b that supply gas are provided in a side face of the second nozzle 249b, enabling gas to be supplied towards the wafers 200. The gas supply holes 250b are opened so as to face towards the center of the reaction tube 203. Plural of the gas supply holes 250b are provided spanning from a lower portion to an upper portion of the reaction tube 203, with each having the same opening area, and moreover each provided at the same opening pitch. A second gas supply system is configured mainly by the second gas supply pipe 232b, the mass flow controller 241b, the valve 243b and the second nozzle 249b. A second inert gas supply system is mainly configured by the second inert gas supply pipe 232f, the mass flow controller 241f and the valve 243f.

A mass flow controller (MFC) 241c that is a flow rate controller (flow rate control unit) and an open-close valve 243c are provided to the third gas supply pipe 232c in sequence from the upstream side. A third inert gas supply pipe 232g is connected further to the downstream side than the valve 243c of the third gas supply pipe 232c. A mass flow controller 241g that is a flow rate controller (flow rate control unit) and an open-close valve 243g are provided to the third inert gas supply pipe 232g in sequence from the upstream side. The third nozzle 249c described above is connected to the leading end portion of the third gas supply pipe 232c. The third nozzle 249c is provided in a circular arc shaped space between an inner wall of the reaction tube 203 and the wafers 200 so as to extend upright along the inner wall of the reaction tube 203 from a lower portion thereof to an upper portion thereof, extending upward in the stacking direction of the wafers 200. Namely, the third nozzle 249c is provided at the side of a wafer placement region where the wafers 200 are disposed, so as to run along the wafer placement region in a region that horizontally surrounds the wafer placement region. The third nozzle 249c is configured as an L-shaped long nozzle provided such that a horizontal portion of the third nozzle 249c passes through a lower portion of the side wall of the reaction tube 203, and a vertical portion of the third nozzle 249c is provided so as to extend upright from at least one end side of the wafer placement region towards the other end side of the wafer placement region. Gas supply holes 250c that supply gas are provided in a side face of the third nozzle 249c. The gas supply holes 250c are opened so as to face towards the center of the reaction tube 203, enabling gas to be supplied towards the wafers 200. Plural of the gas supply holes 250c are provided spanning from a lower portion to an upper portion of the reaction tube 203, with each having the same opening area, and moreover each provided at the same opening pitch. A third gas supply system is configured mainly by the third gas supply pipe 232c, the mass flow controller 241c, the valve 243c and the third nozzle 249c. A third inert gas supply system is mainly configured by the third inert gas supply pipe 232g, the mass flow controller 241g and the valve 243g.

A mass flow controller (MFC) 241d that is a flow rate controller (flow rate control unit) and an open-close valve 243d are provided to the fourth gas supply pipe 232d in sequence from the upstream side. A fourth inert gas supply pipe 232h is connected further to the downstream side than the valve 243d of the fourth gas supply pipe 232d. A mass flow controller 241h that is a flow rate controller (flow rate control unit) and an open-close valve 243h are provided to the fourth inert gas supply pipe 232h in sequence from the upstream side. The fourth nozzle 249d described above is connected to the leading end portion of the fourth gas supply pipe 232d. The fourth nozzle 249d is provided in a circular arc shaped space between an inner wall of the reaction tube 203 and the wafers 200 so as to extend upright along the inner wall of the reaction tube 203 from a lower portion thereof to an upper portion thereof, extending upward in the stacking direction of the wafers 200. Namely, the fourth nozzle 249d is provided at the side of a wafer placement region where the wafers 200 are disposed, so as to run along the wafer placement region in a region that horizontally surrounds the wafer placement region. The fourth nozzle 249d is configured as an L-shaped long nozzle provided such that a horizontal portion of the fourth nozzle 249d passes through a lower portion of the side wall of the reaction tube 203, and a vertical portion of the fourth nozzle 249d is provided so as to extend upright from at least one end side of the wafer placement region toward the other end side of the wafer placement region. Gas supply holes 250d that supply gas are provided in a side face of the fourth nozzle 249d. The gas supply holes 250d are opened so as to face towards the center of the reaction tube 203, enabling gas to be supplied towards the wafers 200. Plural of the gas supply holes 250d are provided spanning from a lower portion to an upper portion of the reaction tube 203, with each having the same opening area, and moreover each provided at the same opening pitch. A fourth gas supply system is configured mainly by the fourth gas supply pipe 232d, the mass flow controller 241d, the valve 243d and the fourth nozzle 249d. A fourth inert gas supply system is mainly configured by the fourth inert gas supply pipe 232h, the mass flow controller 241h and the valve 243h.

A gas supply method of the present exemplary embodiment accordingly transports gas through the nozzles 249a, 249b, 249c, 249d that are disposed inside a circular arc shape vertical length space defined by the inner wall of the reaction tube 203 and edge portions of the plural stacked wafers 200, and ejects gas from the gas supply holes 250a, 250b, 250c, 250d respectively opened in the nozzle 249a, 249b, 249c, 249d, into the reaction tube 203 initially into the vicinity of the wafers 200. The main flow of gas inside the reaction tube 203 is in a direction parallel to the surfaces of the wafers 200, namely a horizontal direction. Gas can be supplied uniformly to each of the wafers 200 due to adopting such a configuration, with the advantageous effect that a uniform film thickness can be achieved for thin films formed on each of the wafers 200. Note that gas remaining after reaction flows in a direction towards an exhaust outlet, namely an exhaust pipe 231, described later. The direction of flow of this residual gas can be appropriately determined by the position of the exhaust outlet, and there is no limitation to the vertical direction.

Organic-based gas from the first gas supply pipe 232a is supplied into the processing chamber 201 through the mass flow controller 241a, the valve 243a and the first nozzle 249a.

Hydrogen-containing gas from the second gas supply pipe 232b is supplied into the processing chamber 201 through the mass flow controller 241b, the valve 243b and the second nozzle 249b.

Specific element-containing gas from the third gas supply pipe 232c is supplied into the processing chamber 201 through the mass flow controller 241c, the valve 243c and the third nozzle 249c.

Nitrogen-containing gas is supplied from the fourth gas supply pipe 232d into the processing chamber 201 through the mass flow controller 241d, the valve 243d and the fourth nozzle 249d.

A gas, such as for example nitrogen (N2) gas is supplied from the inert gas supply pipes 232e, 232f, 232g, 232h into the processing chamber 201, through the respective mass flow controllers 241e, 241f, 241g, 241h, the valves 243e, 243f, 243g, 243h, the gas supply pipes 232a, 232b, 232c, 232d, and the gas nozzles 249a, 249b, 249c, 249d.

Note that when, for example, such gases as described above are flowing from each of the gas supply pipes, an organic-based gas supply system is configured by the first gas supply system. A hydrogen-containing gas supply system is also configured by the second gas supply system. A specific element-containing gas supply system is also configured by the third gas supply system. A nitrogen-containing gas supply system is also configured by the fourth gas supply system.

The exhaust pipe 231 is provided to the reaction tube 203 to exhaust the atmosphere inside the processing chamber 201. As illustrated in FIG. 2, as viewed in transverse cross-section, the exhaust pipe 231 is provided at a side facing towards the side of the reaction tube 203 where the gas supply holes 250a of the first nozzle 249a, the gas supply holes 250b of the second nozzle 249b, the gas supply holes 250c of the third nozzle 249c and the gas supply holes 250d of the fourth nozzle 249d are provided, namely is provided on the opposite side of the wafers 200 to the gas supply holes 250a, 250b, 250c, 250d. Moreover, as viewed in vertical cross-section as illustrated in FIG. 1, the exhaust pipe 231 is provided below the locations of the gas supply holes 250a, 250b, 250c, 250d. Due to such a configuration, the gas supplied from the gas supply holes 250a, 250b, 250c, 250d into the processing chamber 201 in the vicinity of the wafers 200 flows in a horizontal direction, namely in a direction parallel to the main faces of the wafers 200 before then flowing downwards so as to be exhausted by the exhaust pipe 231. The main flow of gas inside the processing chamber 201 is accordingly flow in a horizontal direction as described above. A vacuum pump 246 serving as a vacuum exhaust apparatus is connected to the exhaust pipe 231 through a pressure sensor 245 serving as a pressure detector (pressure detection unit) that detects the pressure inside the processing chamber 201 and to an Auto Pressure Controller (APC) valve 244 serving as a pressure regulator (pressure adjustment unit). Note that the APC valve 244 is a valve configured so as to be capable of vacuum exhausting from inside the processing chamber 201, or stopping vacuum exhausting, by opening or closing a valve with the vacuum pump 246 in an operating state, and also to be capable of regulating the pressure inside the processing chamber 201 by adjusting the degree of valve opening with the vacuum pump 246 in an operating state. An exhaust system is mainly configured by the exhaust pipe 231, the APC valve 244 and the pressure sensor 245. Note that the vacuum pump 246 may also be considered as being contained in the exhaust system. The exhaust system is configured to vacuum exhaust such that the pressure inside the processing chamber 201 obtains a specific pressure (degree of vacuum) by adjusting the degree of valve opening of the APC valve 244 based on pressure data detected by the pressure sensor 245 while operating the vacuum pump 246.

A seal cap 219 serving as a furnace lid body is provided below the reaction tube 203 so as to be capable of hermetically sealing a bottom end opening of the reaction tube 203. The seal cap 219 is provided so as to make contact from the vertical direction bottom side with the bottom end of the reaction tube 203. The seal cap 219 is, for example, made from a metal such as stainless steel and formed in a circular dish shape. An O-ring 220 serving as a seal member is provided on the top face of the seal cap 219 so as to make contact with the bottom end of the reaction tube 203. A rotation mechanism 267 that rotates a boat is installed on the opposite side of the seal cap 219 to the processing chamber 201 side. A rotation shaft 255 of the rotation mechanism 267 passes through the seal cap 219 and is connected to the boat 217 in a configuration such that the wafers 200 are rotated by rotating the boat 217. The seal cap 219 is configured so as to be raised or lowered in the vertical direction by a boat elevator 115 serving as a raise and lower mechanism vertically installed to a portion external to the reaction tube 203, thereby enabling the boat 217 to be loaded or unloaded into or out of the processing chamber 201.

The boat 217 serving as a substrate support jig is made from a heat resistant material such as for example quartz or silicon carbide, in a configuration such that plural wafers 200 are supported in horizontal orientation, centered with respect to one another, in a multi-layer stacked state. A heat insulation member 218 made from a heat resistant material such as for example quartz or silicon carbide is provided below the boat 217, in a configuration such that heat from the heater 207 is not readily transmitted to the seal cap 219 side. Note that the heat insulation member 218 may be configured including plural heat insulation plates made from a heat resistant material such as for example quartz or silicon carbide, with a heat insulation plate holder that supports the heat insulation plates multi-stacked in a horizontal orientation.

A temperature sensor 263 is placed as a temperature detector inside the reaction tube 203, and configuration is made such that a desired temperature distribution is achieved for the temperature within the processing chamber 201 by adjusting the conduction state to the heater 207 based on temperature data detected by the temperature sensor 263. The temperature sensor 263 is configured in an L-shape similar to the nozzles 249a, 249b, 249c, 249d, and is provided so as to run along the inner wall of the reaction tube 203.

Figure 3:
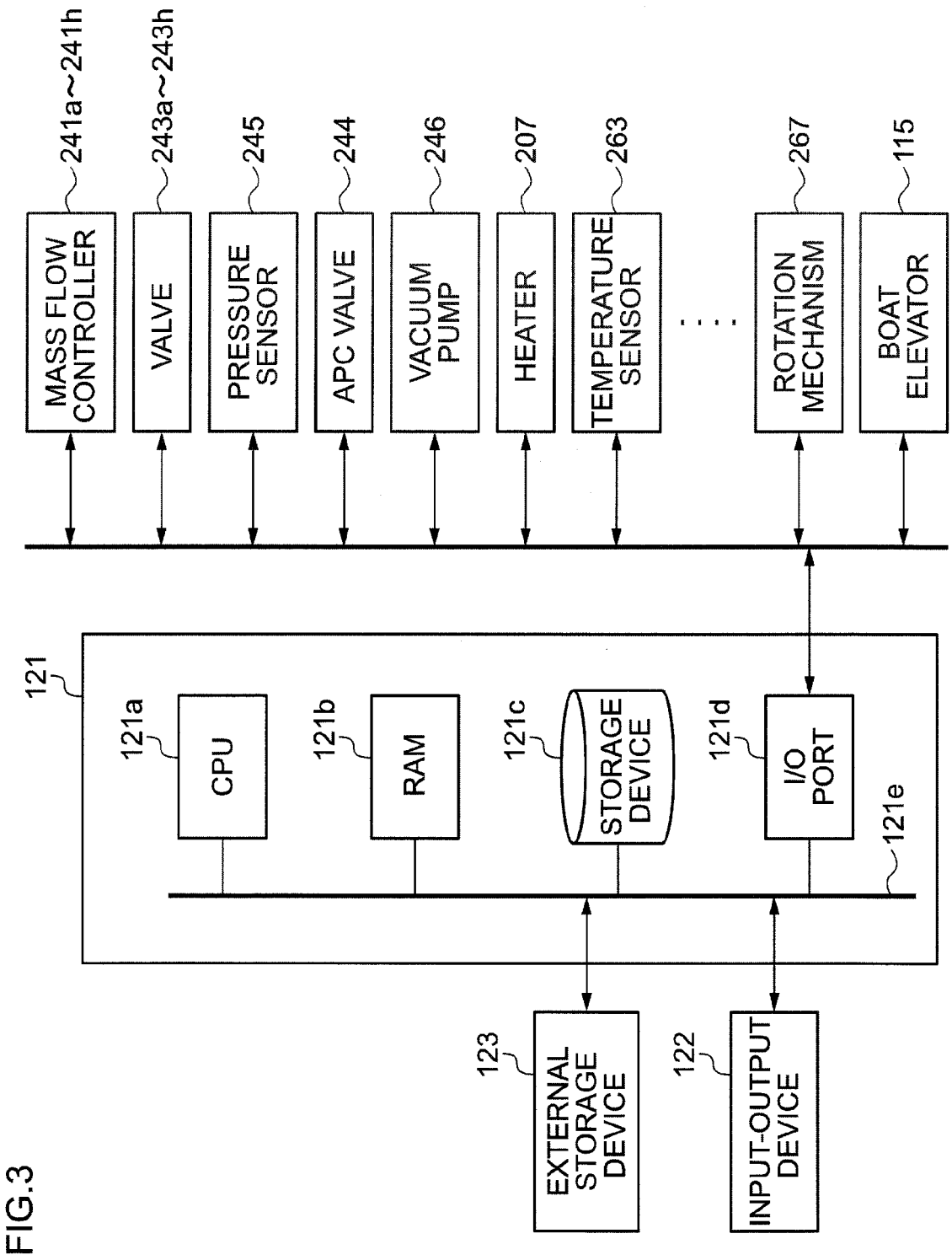
FIG. 3 is a schematic configuration diagram of a controller of a substrate processing apparatus preferably employed in an exemplary embodiment of the present invention.

As illustrated in FIG. 3, a controller 121 that is a controller (control unit) is configured as a computer including a Central Processing Unit (CPU) 121a, Random Access Memory (RAM) 121b, a storage device 121c and an I/O port 121d. The RAM 121b, the storage device 121c and the I/O port 121d are configured capable of exchanging data with the CPU 121a though an internal bus 121e. An input-output device 122 such as, for example, a touch panel, is connected to the controller 121.

The storage device 121c is configured for example by flash memory or a Hard Disk Drive (HDD). The storage device 121c is readably stored with such items as a control program for controlling operation of the substrate processing apparatus, and a process recipe stored with procedures and conditions for substrate processing, described later. Note that the process recipe functions as a program executed in the controller 121 to combine each procedure in a substrate processing step, described later, so as to be able to achieve a specific result. In the following, the process recipe and the control program etc. are sometimes referred to in general simply as program. Note that in the present specification, when the term program is employed this includes cases of the process recipe alone, cases of the control program alone, and cases of both together. The RAM 121b is configured as a memory region (work area) for temporarily holding a program and data that has been read by the CPU 121a.

The I/O port 121d is connected to the mass flow controllers 241a, 241b, 241c, 241d, 241e, 241f, 241g, 241h, the valves 243a, 243b, 243c, 243d, 243e, 243f, 243g, 243h, the pressure sensor 245, the APC valve 244, the vacuum pump 246, the heater 207, the temperature sensor 263, the rotation mechanism 267 and the boat elevator 115.

The CPU 121a is configured so as to read and execute the control program from the storage device 121c, and to read the process recipe from the storage device 121c according for example to the input of an operation command from the input-output device 122. The CPU 121a is configured to then, following the contents of the process recipe that has been read, perform flow rate adjustment operation of each type of gas using the mass flow controllers 241a, 241b, 241c, 241d, 241e, 241f, 241g, 241h, perform opening and closing operations on the valves 243a, 243b, 243c, 243d, 243e, 243f, 243g, 243h, perform opening and closing operation on the APC valve 244 and pressure adjustment operation based on the pressure sensor 245 using the APC valve 244, temperature adjustment operation of the heater 207 based on the temperature sensor 263, start up and stopping of the vacuum pump 246, rotation and rotation speed adjustment operation on the boat 217 using the rotation mechanism 267, and perform control such as raising and lowering operations of the boat 217 using the boat elevator 115.

Note that the controller 121 is not limited to cases of configuration by a dedicated computer, and may be configured as a general purpose computer. For example, the controller 121 according to the present exemplary embodiment can be configured by preparing an external storage device (for example magnetic tape, a magnetic disk such as a flexible disk or hard disk, an optical disk such as a CD or a DVD, a magneto optical disk such as an MO, or a semiconductor memory such as a USB memory or memory card), and then employing such an external storage device 123 to install a program on a general purpose computer. Note that there is no limitation to cases in which the external storage device 123 is employed as a mechanism for supplying a program to a computer. Moreover, a program may be supplied using the internet or a dedicated communication line, without using the external storage device 123. Note that the storage device 121c and the external storage device 123 are configured as computer readable storage media. In the following, these are referred to in general simply as a storage medium/media. Note that when the term storage medium is used in the present specification this includes cases of the storage device 121c alone, cases of the external storage device 123 alone, and cases of both devices together.

Explanation next follows regarding use of the above substrate processing apparatus, and regarding a method of supplying an organic-based gas and a hydrogen-containing gas into the processing chamber 201 to form a film containing carbon (carbon-based film) on the wafers 200 serving as substrates. In the present exemplary embodiment, explanation is given of an example in which 1-octene ($C_8H_{16}$, abbreviation: octene) gas is employed as the organic-based gas, and hydrogen ($H_2$) is employed as the hydrogen-containing gas, and an amorphous carbon film (an a-C film) is formed in a non-plasma atmosphere as a film containing carbon. The organic-based gas acts as a carbon source during a-C film formation. Octene is employed as the organic-based gas in the present exemplary embodiment, and is a hydrocarbon, namely a type of hydrocarbon compound, and can be referred to as a substance containing a hydrocarbon that is formed from only two elements, the element carbon and the element hydrogen. Note that octene can also be referred to as a hydrocarbon-based gas, and can also be referred to as a hydrocarbon gas or as a hydrocarbon compound gas. Note that in the present exemplary embodiment semiconductor silicon wafers are employed as the wafers 200, and formation of the film containing carbon (carbon-based film) is performed as one step in manufacturing steps of a semiconductor device. Note that a carbon-based film such as an a-C film is an insulating film with an extremely high resistance to etching, and is appropriately employed in a step for manufacturing such elements as a gate surround or line structure of a transistor.

When the plural wafers 200 have been loaded into the boat 217 (wafer charging), the boat 217 on which the plural wafers 200 are supported is raised up by the boat elevator 115 and loaded into the processing chamber 201 (boat loading), as illustrated in FIG. 1, such that the plural wafers 200 are accommodated inside the processing chamber 201. In this state the seal cap 219 achieves a sealed state through the O-ring 220 with the bottom end of the reaction tube 203.

Next, with the vacuum pump 246 in an operated state, the APC valve 244 is then gradually fully opened, and the inside of the processing chamber 201 is vacuum exhausted by the vacuum pump 246, such that the base pressure inside the processing chamber 201 (the degree of vacuum) is 1 Pa or less. Note that the vacuum pump 246 is maintained in a normal operation state at least until processing on the wafers 200 has been completed. The wafers 200 are rotated (wafer rotation) by rotating the boat 217 using the rotation mechanism 267. Preferably a constant rotation speed is maintained, for example within the range of 1 rpm to 10 rpm. Note that rotation of the boat 217 and the wafers 200 using the rotation mechanism 267 is performed continuously at least until processing on the wafers 200 has been completed. The temperature inside the processing chamber 201 is made the desired temperature by heating inside the processing chamber 201 using the heater 207. The temperature of the wafers 200 is preferably maintained at the desired temperature, for example within a range of 600° C. to 700° C. When this is performed, the amount of power supply to the heater 207 is feedback controlled based on temperature data detected by the temperature sensor 263 so as to achieve the desired temperature distribution within the processing chamber 201 (temperature regulation). Note that heating inside the processing chamber 201 by the heater 207 is performed continuously at least until processing on the wafers 200 has been completed.

Then, nitrogen ($N_2$) gas is supplied from the inert gas supply pipes 232e, 232f into the processing chamber 201, preferably at a rate of for example several liters per minute, through the mass flow controller 241e, 241f, the valves 243e, 243f, the gas supply pipes 232a, 232b, and the gas nozzles 249a, 249b. Nitrogen purging is executed at a given pressure for several minutes, and then the supply of nitrogen gas is stopped and nitrogen purging ended.

Then, in a state in which the APC valve 244 is fully opened, the inside of the processing chamber 201 is vacuum exhausted using the vacuum pump 246, and the base pressure in the processing chamber 201 is lowered, preferably to 1 Pa or lower. When the pressure inside the processing chamber 201 has become 1 Pa or lower, the APC valve 244 is closed completely, starting a confined state. Note that configuration may be made such that at this stage the APC valve 244 is left open by a small amount and is not completely closed.

The temperature of the wafers 200 is preferably maintained at a desired temperature, for example within a range of from 600° C. to 700° C., and the wafers 200 are preferably maintained rotating at a desired rotation rate, for example within a range of 1 rp to 10 rm. In a completely closed state of the APC valve 244, octene gas serving as the organic-based gas is then introduced from the first gas supply pipe 232a into the processing chamber 201 through the mass flow controller 241a, the open-close valve 243a and the first nozzle 249a. At the same time, $H_2$ gas serving as the hydrogen-containing gas is introduced from the second gas supply pipe 232b into the processing chamber 201 through the mass flow controller 241b, the valve 243b and the second nozzle 249b. Octene gas and $H_2$ gas is confined inside the processing chamber 201 by the above operations (step A). The $H_2$ gas is preferably introduced at a desired flow rate, for example within a range of 0.1 slm to 10 slm. The duration of $H_2$ gas supply is preferably a desired duration, for example within a range of 1 second to 300 seconds, and the duration of octene gas supply is preferably a desired duration, for example within a range of 1 second to 300 seconds. Octene gas and $H_2$ gas are then preferably confined inside the processing chamber 201 at a desired pressure, for example within a range of 1000 Pa to 20000 Pa.

The supply of octene gas and $H_2$ gas into the processing chamber 201 is then stopped and, in a completely closed state of the APC valve 244, octene gas and $H_2$ gas are maintained in a confined state inside the processing chamber 201 (step B). The duration for which the supply of octene gas and $H_2$ gas is stopped, namely the duration for which octene gas and $H_2$ gas are maintained in a confined state in the processing chamber 201, is preferably a desired duration, for example within a range of 1 to 90 minutes.

Note that in step A and/or step B, configuration may be made such that the APC valve 244 is not closed completely, and is instead left slightly open such that there is a slight flow slightly exhausting each of the gases. In such cases configuration may be made such that in step B there is slight supply of octene gas and $H_2$ gas into the processing chamber 201, rather than supply being stopped completely. Namely, continuous supply may be performed of octene gas and $H_2$ gas into the processing chamber 201 over step A and step B. In such cases, in step A and step B each of the gases are exhausted from inside the processing chamber 201 while also being supplied into the processing chamber 201, and slight exhausting of each of the gases may be performed by maintaining a state in which the rate of exhaustion of each of the gases from inside the processing chamber 201 is smaller than the supply rate of each of the gases into the processing chamber 201. Namely, in the step A and/or step B, each of the gases may be slightly exhausted by maintaining a state in which the total gas exhaustion rate from the processing chamber 201 (the total gas exhaustion amount per unit time at a specific pressure, namely the exhaustion flow rate (volumetric flow rate)), is smaller than the total gas supply rate into the processing chamber 201 (the total gas supply amount per unit time at a specific pressure, namely the supply flow rate (volumetric flow rate)). In such cases, for example, in step A exhaustion from the processing chamber 201 may be performed while supplying each of the gases into the processing chamber 201, in a configuration in which the exhaustion rate of each of the gases from inside the processing chamber 201 is smaller than the supply rate of each of the gases into the processing chamber 201, with this state maintained in step B. Namely, in this case, a state is maintained in step A and step B in which the exhaustion rate of each of the gases from inside the processing chamber 201 is smaller than the supply rate of each of the gases into the processing chamber 201.

By thus configuring so as to slightly exhaust each of the gases, and also so as to slightly exhaust while slightly supplying each of the gases, a confined state can be formed that is essentially the same as the state achieved with the APC valve 244 completely closed. Consequently, in the present specification, such a state in which each of the gases is slightly exhausted, and also such a state in which slight exhausting is performed whilst slightly supplying each of the gases, are both considered to be included within the definition of a confined state. Namely, in the present specification, when the term "confined" is employed this includes cases when the APC valve 244 is completely closed and exhausting from inside the processing chamber 201 is stopped, and also cases when the APC valve is not completely closed but is left slightly open with each of the gases being slightly exhausted, and cases in which a state is maintained in which the APC valve is not completely closed but is left slightly open with the exhaustion rate of each of the gases from the processing chamber 201 made smaller than the supply rate of each of the gases into the processing chamber 201.

a-C is grown on the wafers 200 through executing step A and step B, and as a result an a-C film is formed on the wafers 200. Then, after step A and step B have been performed a specific number of times, the APC valve 244 is completely opened, and the inside of the processing chamber 201 is quickly exhausted (step C). Namely, purging is performed to remove octene gas and H$_2$ gas from within the processing chamber 201 that either remains unreacted inside the processing chamber 201 or after they have contributed to the a-C film forming, and also remove any reactant by-products.

Figure 4:
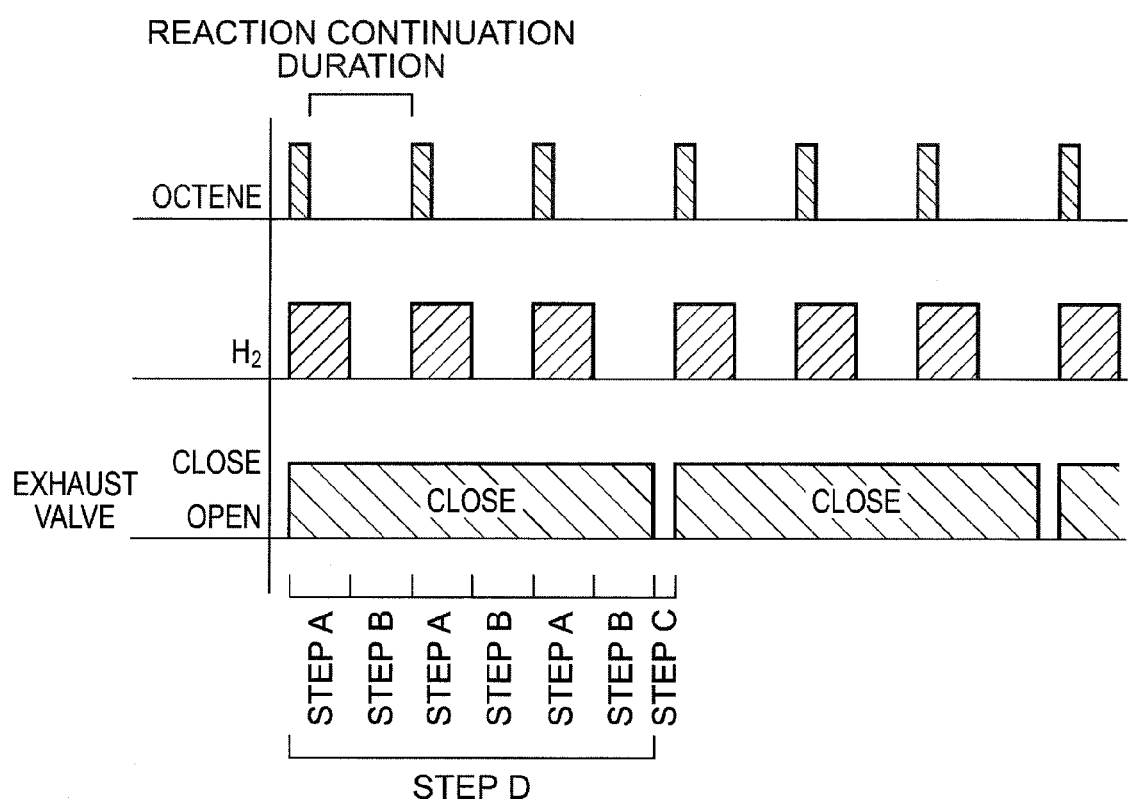
FIG. 4 is a diagram to explain a film-forming sequence of an exemplary embodiment of the present invention.

A cycle that is configured including step A, step B, and step C, namely a cycle configured including a step (step D), of executing step A and step B a specific number of times, and step C, is executed a specific number of times so as to form the a-C film on the wafers 200 to the desired film thickness. The a-C film of the desired film thickness may also be formed by performing this cycle a single time, or the a-C film of the desired film thickness may be formed by performing this cycle plural times. Note that preferably this cycle is repeated a plural number of times when the desired film thickness is comparatively thick. In such cases, a relatively thin a-C film is formed at each cycle, and film-forming of the a-C film of the desired film thickness can be achieved by stacking these thin a-C films, and good step coverage characteristics can be obtained even when a comparatively thick a-C film is formed. An example of a cycle sequence of the present exemplary embodiment is illustrated in FIG. 4. Note that FIG. 4 illustrates an example in which plural repetitions are performed of a cycle configured including a step (step D) of 3 executions of step A and step B, and step C. Note that configuration may be made with plural repetitions of a cycle of a step (step D) of 1 execution of the step A and the step B, and the step C.

Then, nitrogen (N$_2$) gas is supplied from the inert gas supply pipes 232e, 232f into the processing chamber 201, preferably at a rate of for example several liters per minute, through the mass flow controller 241e, 241f, the valves 243e, 243f, the gas supply pipes 232a, 232b, and the gas nozzles 249a, 249b. Nitrogen purging is performed at a given pressure, preferably for example for several minutes, and then the supply of nitrogen gas is stopped and nitrogen purging ended.

Then rotation of the boat 217 by the rotation mechanism 267 is stopped, the APC valve 244 is closed, and nitrogen (N$_2$) gas is supplied from the inert gas supply pipes 232e, 232f into the processing chamber 201, preferably at a rate of for example several liters per minute, through the mass flow controller 241e, 241f, the valves 243e, 243f, the gas supply pipes 232a, 232b, and the gas nozzles 249a, 249b, until atmospheric pressure is achieved for the pressure inside the processing chamber 201 (atmospheric pressure recovery).

The boat 217, on which the wafers 200 that have completed film-forming processing are supported, is then unloaded from inside the processing chamber 201 by the boat elevator 115 (boat unloading). Then the plural wafers 200 are removed from the boat 217 after the film-forming processing.

In the present exemplary embodiment as described above, as illustrated in FIG. 4, plural alternate repetitions are performed of: the step (step D), in which 3 repetitions (3 times) are alternately performed of the step (step A) of supplying octene gas and H$_2$ gas into the processing chamber 201 and confining, and the step (step B) of maintaining the confined state of octene gas and H$_2$ gas in the processing chamber 201; and the step C of exhausting from inside the processing chamber 201. Namely, in the present exemplary embodiment, configuration is made such that plural cycles are repeated of a cycle configured by the step D, this being plural cycles (3 cycles) respectively configured by step A and step B, and the step C.

Note that in the present exemplary embodiment, the step C is executed a single time for every 3 times the cycle configured by the step A and the step B is performed, however the step C may be performed every time the cycle configured by the step A and the step B is performed. Namely, configuration may be made with the plural alternate repetitions of the step configured by one time each alternately of the step A and the step B, and the step C. Such cases result in a cycle configured by the step A, the step B, and the step C being repeatedly preformed plural times.

Moreover, configuration may be made such that the step C is performed each time the cycle configured by the step A and the step B is performed, the supply amount of octene gas and H$_2$ gas for each time of step A is made greater than the supply amount of octene gas and H$_2$ gas each time in the present exemplary embodiment (for example by making the supply amount three times the supply amount of octene gas and H$_2$ gas for each time of step A in the present exemplary embodiment, so as to achieve a similar supply amount to the supply amount when 3 cycles of the cycle configured by the step A and the step B are performed). However, in such cases, although the film-forming speed is increased thereby due to supplying a greater amount of gas at each time of supply, the pressure in the processing chamber 201 rises rapidly, and so there is a possibility of deterioration in the uniformity of film thickness either wafer in-plane or between wafers.

In contrast thereto, configuration may be made such that the step C is performed each time the cycle configured by the step A and the step B is performed, and the supply amount of octene gas and H$_2$ gas for each time of the step A is made small (for example similar to the supply amount of octene gas and H$_2$ gas each time during the step A of the present exemplary embodiment, or smaller than the supply amount each time). So doing achieves good uniformity of wafer in-plane film thickness, however the film-forming speed is decreased.

In the present exemplary embodiment, the step C is executed once every 3 times the cycle configured by the step A and the step B is performed. Namely, with the APC valve 244 in a completely closed state, octene gas and H$_2$ gas are each respectively supplied divided over plural times (3 times), with the pressure in the processing chamber 201 gradually rising in stages (in 3 stages in this case). In the first stage (the first cycle) the pressure is the lowest and the film-forming rate is the lowest out of the 3 stages, however the best wafer in-plane film thickness uniformity is achieved. In contrast thereto, in the third stage (third cycle), the pressure is the highest and the film-forming rate is the highest out of the 3 stages, however the possibility of a deterioration in the wafer in-plane film thickness uniformity arises. The second stage (second cycle) has intermediate characteristics to those of the first stage (first cycle) and the third stage (third cycle).

However, when, as in the present exemplary embodiment, the pressure is increased in plural stages, such as 3 stages, due to forming a film with good wafer in-plane uniformity during the first stage (first cycle), during the second stage and the third stage this film with good wafer in-plane uniformity acts as a base film, and so a film is also formed with good wafer in-plane uniformity in the later stages due to the beneficial influence of the base film. Thus in such cases in which the pressure is increased in multiple stages, a layer can be formed with good wafer in-plane uniformity at the initial stage, enabling subsequent increases in film-forming rate whilst still securing wafer in-plane uniformity.

Note that in the present exemplary embodiment, as illustrated in FIG. 4, the supply duration of H$_2$ gas is longer than the supply duration of octene gas, however configuration may be made with the supply duration of H$_2$ gas and the supply duration of octene gas equivalent to each other, or with the supply duration of H$_2$ gas shorter than the supply duration of octene gas.

According to the technique of the present exemplary embodiment, an a-C film can, for example, be formed that has 90% to 100% step coverage for wafers 200 that include indentation portions such as high aspect ratio trenches and vias that have aspect ratios of 5 or greater.

Due to thermal decomposition of octene gas, in the step A in which octene gas and $H_2$ gas are supplied into the processing chamber 201 and confined, the pressure inside the processing chamber 201 is preferably made a pressure within a range of 1000 to 20000 Pa by supplying octene gas and $H_2$ gas into the processing chamber 201. The temperature of the heater 207 is also preferably set as a temperature such that the temperature of the wafers 200 is within a range of 600° C. to 700° C. Note that configuration may be made such that $N_2$ gas is supplied as a non-reactive gas into the processing chamber 201 through the inert gas supply pipes 232e, 232f. Moreover, a gas other than $N_2$ gas, such as a noble gas such as Ar gas, He gas, Ne gas or Xe gas, may be employed as the inert gas.

Note that thermal decomposition of octene gas and $H_2$ gas becomes more difficult when the temperature of the wafers 200 is less than 600° C., the reactions described above do not readily occur, and it becomes difficult to form the a-C film. Gas phase reaction is, however, too strong when the temperature of the wafers 200 exceeds 700° C. and it becomes difficult to secure wafer in-plane uniformity. It is accordingly preferable for the temperature of the wafers 200 to be a temperature within a range of 600° C. to 700° C.

Moreover, the reactions by octene gas and $H_2$ gas described above do not readily occur when the pressure inside the processing chamber 201 is less than 1000 Pa. A lot of time is taken to exhaust from inside the 201 in the step C when the pressure inside the processing chamber 201 exceeds 20000 Pa, with a detrimental effect on throughput. Moreover, gas phase reactions are too strong and it becomes difficult to secure wafer in-plane uniformity. It is accordingly preferable for the pressure inside the processing chamber 201 to be a pressure within the range of 1000 to 20000 Pa.

In the processing chamber 201 under the above atmosphere (conditions), the film-forming rate dramatically deteriorates when the organic-based gas supply flow rate is less than 100 sccm. Moreover, uniformity of film thickness dramatically deteriorates when the supply flow rate of octene gas exceeds 10000 sccm. The supply flow rate of octene gas is accordingly preferably a flow rate within a range of 100 to 10000 sccm (0.1 to 10 slm).

Moreover, difficulties arise from the perspective of valve control when octene gas supply duration is less than 1 second. The supply duration of octene gas is preferably made as short as possible, and the reaction continuation duration (octene gas supply stop duration) is preferably made as long as possible. Namely, preferably an appropriate amount of octene gas is supplied over a short period of time. It is accordingly preferable for the supply duration of octene gas to be a duration within a range of 1 to 300 seconds.

Moreover, in the processing chamber 201 under such an atmosphere (conditions), the reactions described above do not readily occur when the supply flow rate of $H_2$ gas is less than 100 sccm. Moreover, there is a lot of $H_2$ gas that does not contribute to the reaction when the supply flow rate of $H_2$ gas exceeds 10000 sccm, with this being wasted. It is accordingly preferable for the supply flow rate of $H_2$ gas to be a flow rate that is within a range of 100 to 10000 sccm (0.1 to 10 slm).

Moreover, difficulties arise from the perspective of valve control when the supply duration of $H_2$ gas is less than 1 second. The supply duration of $H_2$ gas is preferably made as short as possible, and the reaction continuation duration is preferably made as long as possible. Namely, preferably an appropriate amount of $H_2$ gas is supplied over a short period of time. It is accordingly preferable for the supply duration of $H_2$ gas to be a duration within a range of 1 to 300 seconds.

In step B, in which the supply of octene gas and $H_2$ gas into the processing chamber 201 is stopped and the confined state of octene gas and $H_2$ gas in the processing chamber 201 is maintained, the reaction initiated in the above step A continues. The a-C film grows on the wafers 200 by the continuation of this reaction.

Note that the confined state of octene gas and $H_2$ gas inside the processing chamber 201 is maintained since octene gas and $H_2$ gas do not readily react and the reaction speed is extremely slow (it takes time for reaction). The above reaction accordingly occurs sufficiently due to taking time, thereby enabling the a-C film to be formed.

When this is performed, the pressure inside the processing chamber 201 is preferably maintained at a pressure within a range of 1000 to 20000 Pa. The temperature of the heater 207 at this stage is preferably set such that the temperature of the wafers 200 becomes a temperature within a range of 600° C. to 700° C. Namely, the pressure is maintained within a range and the temperature is maintained within a range that are similar to those of step A.

Note that octene gas supply stop duration is preferably a duration within for example a range of 1 to 90 minutes. The above described reaction is insufficient when octene gas supply stop duration is less than 1 minute. The amount of octene gas and $H_2$ gas decreases as this reaction progresses to a certain extent, leading to a drop in reaction efficiency even though reaction takes place. Film-forming continues in a state of lowered film-forming rate even when this state persists. Namely, if octene gas supply stop duration is too long there is a detrimental effect on the throughput. Octene gas supply stop duration is accordingly preferably a duration within a range of 1 to 90 minutes.

A film-forming rate of a-C film formed by the present exemplary embodiment (the film-forming rate for one cycle (the cycle configured by the step A and the step B)) has for example been confirmed at 1 nm/cycle, and a given film thickness can be obtained by controlling the number of cycles. For example, an example is 50 to 200 Å (5 to 20 nm) for a film thickness of a-C film in a case in which an a-C film is applied as an etching stopper. In such a case this film thickness can be achieved by performing the above cycle for 5 to 20 cycles.

In the present exemplary embodiment, octene gas and $H_2$ gas are supplied into the processing chamber 201 and confined, and so it is possible to raise the reaction efficiency even for cases employing such as octene gas and $H_2$ gas that are non-readily reacting gases in medium and low temperature regions, enabling the film-forming efficiency (such as the consumption of octene gas and $H_2$ gas, and the film-forming rate) to be improved.

Figure 5:
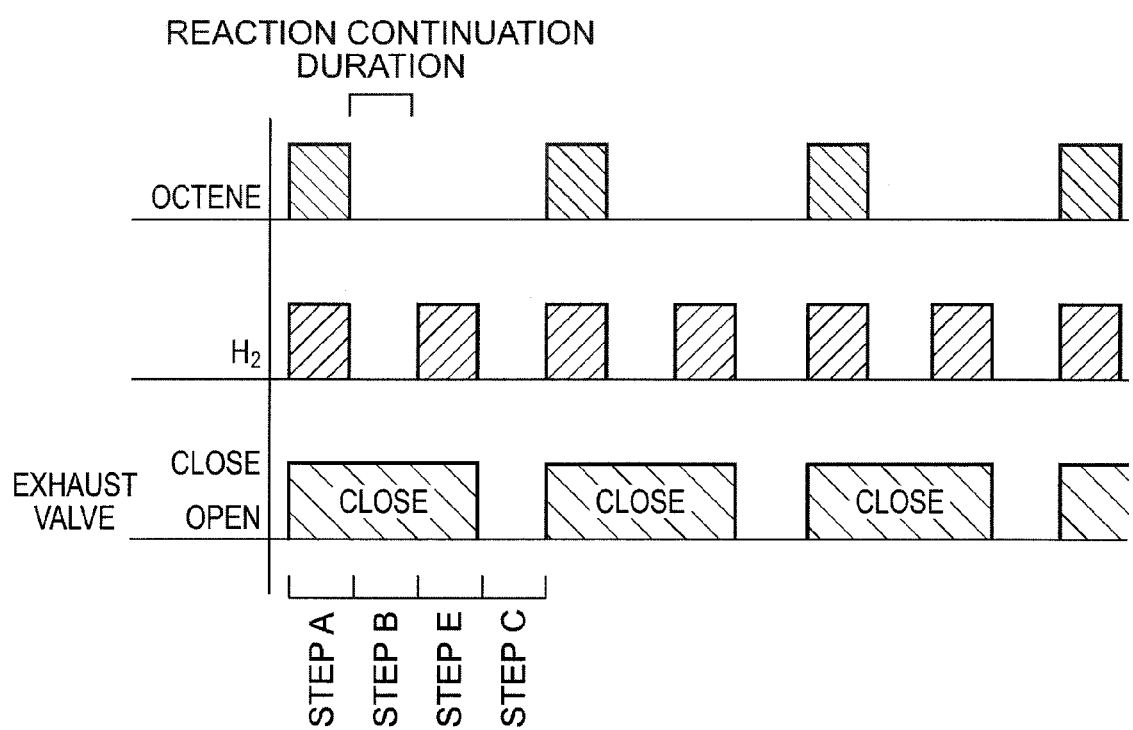
FIG. 5 is a diagram to explain another example of a film-forming sequence of an exemplary embodiment of the present invention.

In the present exemplary embodiment, explanation has been given of an example in which the step C is executed once for every 3 cycles performed of the cycle configured by the step A and the step B, however configuration may be made such that the step C is performed for each cycle of the cycle configured by the step A and the step B. When this approach is adopted, as illustrated in FIG. 5, preferably hydrogen-containing gas is supplied into the processing chamber 201 (step E) after the step B has been performed and before the step C is performed. FIG. 5 illustrates an example in which $H_2$ gas is supplied as the hydrogen-containing gas in the step E.

In such cases, an a-C film of the desired film thickness is formed on the wafers 200 by executing a cycle configured by the step A, the step B, the step E, and the step C a specific number of times. The thus configured cycle may be performed a single time so as to form the a-C film of the desired film thickness, or this cycle may be performed plural times to form the a-C film of the desired film thickness. Note that preferably this cycle is repeated a plural number of times when the desired film thickness is comparatively thick. In such cases, a relatively thin a-C film is formed for each cycle, and film-forming of the a-C film of the desired film thickness can be achieved by stacking these thin a-C films, and good step coverage characteristics can be obtained even when a comparatively thick a-C film is formed. FIG. 5 illustrates an example in which a cycle configured by the step A, the step B, the step E, and the step C is repeated plural times. Moreover, FIG. 5 illustrates an example in which the supply duration of $H_2$ gas and the supply duration of octene gas in step A are made equivalent to each other.

In such a case, for step E, in an octene gas supply stopped state $H_2$ gas is supplied to inside the processing chamber 201, where the reaction has progressed to a certain extent due to maintaining the confined state of octene gas and $H_2$ gas at step B. The $H_2$ gas is preferably introduced for example at a desired flow rate within a range of 0.1 to 10 slm. The duration of $H_2$ gas supply is preferably a desired duration for example of 1 second to 300 seconds. Other process conditions are similar to the processing conditions of step B.

$H_2$ gas purging can accordingly be achieved on the outermost surface of the wafers 200, namely on the outermost surface of the a-C film formed on the wafers 200 by step A and step B. When this is performed, some of the $H_2$ gas thermally decomposes, and a small amount of atomic hydrogen (H) arises, such that there is a small amount of atomic hydrogen contained in $H_2$ gas. By purging with this $H_2$ gas, octene gas can be removed that has become physically adsorbed onto the outermost surface of the a-C film formed on the wafers 200 and cannot react any further, or for which reaction has become more difficult to progress. Moreover, by purging with this $H_2$ gas, after octene gas removal a state can be achieved in which hydrogen terminal ends are present on the outermost surface of the a-C film. Such processing means that the outermost surface of the a-C film thereby acts as a base for film-forming in the next cycle, enabling a state to be achieved that facilitates growth when the a-C film is formed the next time.

Figure 6:
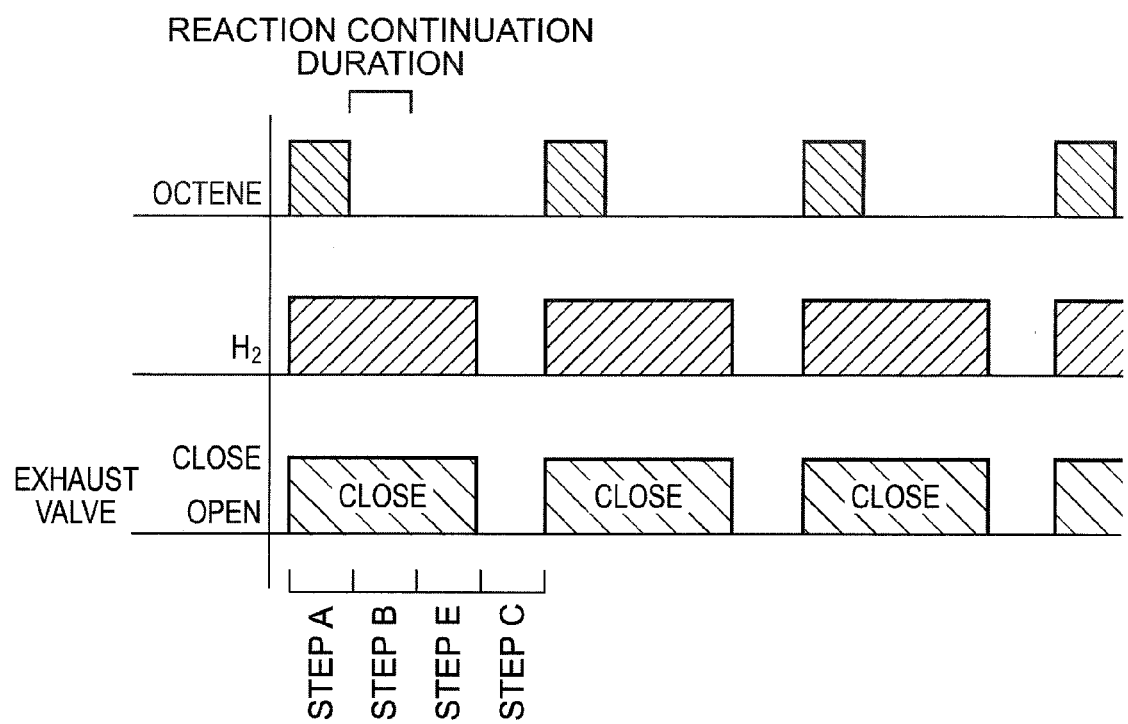
FIG. 6 is a diagram to explain yet another example of a film-forming sequence of an exemplary embodiment of the present invention.

Moreover, when this is performed, hydrogen-containing gas may be supplied into the processing chamber 201 in the step B, as illustrated in FIG. 6. Namely, hydrogen-containing gas may be supplied continuously from step A to step E. FIG. 6 illustrates an example in which $H_2$ gas is supplied as the hydrogen-containing gas in step B, namely an example in which $H_2$ gas is continuously supplied from step A to step E.

Moreover, although in the present exemplary embodiment explanation has been given of an example in which an amorphous carbon film (a-C film) is formed as the carbon-based thin film, a poly-crystalline carbon film (p-C film) or a diamond-like carbon film (DLC film) can be formed as the carbon-based film.

Moreover, by providing a step other than the above in which a specific element-containing gas is supplied for a period when at least octene gas supply is stopped, for example at step B when the supply of octene gas and $H_2$ gas is stopped, or by providing a step in which a specific element-containing gas is supplied and a step in which nitrogen-containing gas is supplied, film can be formed as the carbon-based thin film that contains a specific element other than carbon (other element), such as at least one type of film from films including: a silicon carbide film (SiC film), a silicon carbonitride film (SiCN film), a boron carbide film (BC film), a boron carbonitride film (BCN film), an aluminum carbide film (AlC film), an aluminum carbonitride film (AlCN film), an aluminum silicon carbide film (AlCiC film), a titanium carbide film (TiC film), a titanium carbonitride film (TiCN film), a tantalum carbide film (TaC film), a tantalum carbonitride film (TaCN film), a molybdenum carbide film (MoC film), a molybdenum carbonitride film (MoCN film), a tungsten carbide film (WC film) and a tungsten carbonitride film (WCN film). Namely, a film containing a specific element and carbon, or a film containing a specific element, carbon and nitrogen can be formed as the carbon-based thin film. Note that the specific element is a general term referring to elements including for example metalloid elements such as silicon (Si) and boron (B), namely semiconductor elements, and metal elements such as aluminum (Al), titanium (Ti), tantalum (Ta), molybdenum (Mo) and tungsten (W). Namely, specific element-containing gas is a general term referring to gases including for example metalloid element-containing gases such as a silicon-containing gas and a boron-containing gas, metal element-containing gases, such as an aluminum-containing gas, a titanium-containing gas, a tantalum-containing gas, a molybdenum-containing gas and a tungsten-containing gas.

Figure 7:
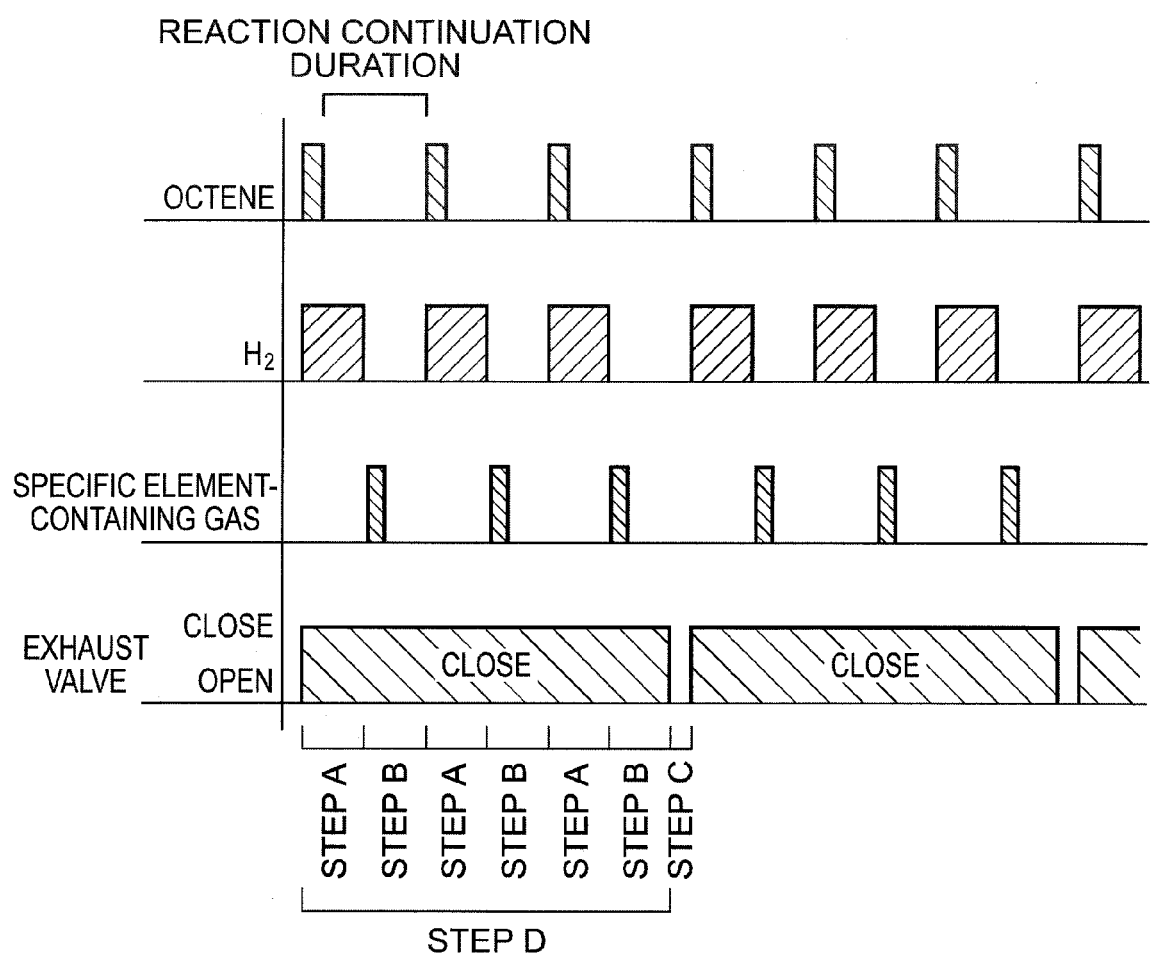
FIG. 7 is a diagram to explain yet another example of a film-forming sequence of an exemplary embodiment of the present invention.

For example, a SiC film can be formed as the carbon-based thin film by providing a step in step B as illustrated in FIG. 7 in which a silicon-containing gas, such as hexachlorodisilane ($Si_2Cl_6$, abbreviated name: HCDS) is supplied as the specific element-containing gas. Note that the processing conditions when this is performed can for example be similar processing conditions to those of the exemplary embodiment described above.

The specific element-containing gas is supplied from the third gas supply pipe 232c into the processing chamber 201 through the mass flow controller 241c, the valve 243c and the third nozzle 249c.

Note that a BC film can be formed as the carbon-based thin film by, for example, providing a step as illustrated in FIG. 7 of supplying a boron-containing gas such as boron trichloride ($BCl_3$) as the specific element-containing gas in place of a silicon-containing gas. Note that the processing conditions when this is performed may for example be similar processing conditions to the processing conditions in the above exemplary embodiment.

Moreover, an AlC film, a TiC film, a TaC film, a MoC film and a WC film can be respectively formed as the carbon-based thin film by providing a step as illustrated in FIG. 7 of supplying an aluminum-containing gas, a titanium-containing gas, a tantalum-containing gas, a molybdenum-containing gas and a tungsten-containing gas, such as for example aluminum trichloride ($AlCl_3$), titanium tetrachloride ($TiCl_4$), tantalum pentachloride ($TaCl_5$), molybdenum pentachloride ($MoCl_5$) and tungsten hexachloride ($WCl_6$) as the specific element-containing gas in place of the silicon-containing gas. Note that the processing conditions when this is performed may for example be similar processing conditions to the processing conditions in the above exemplary embodiment.

Figure 8:
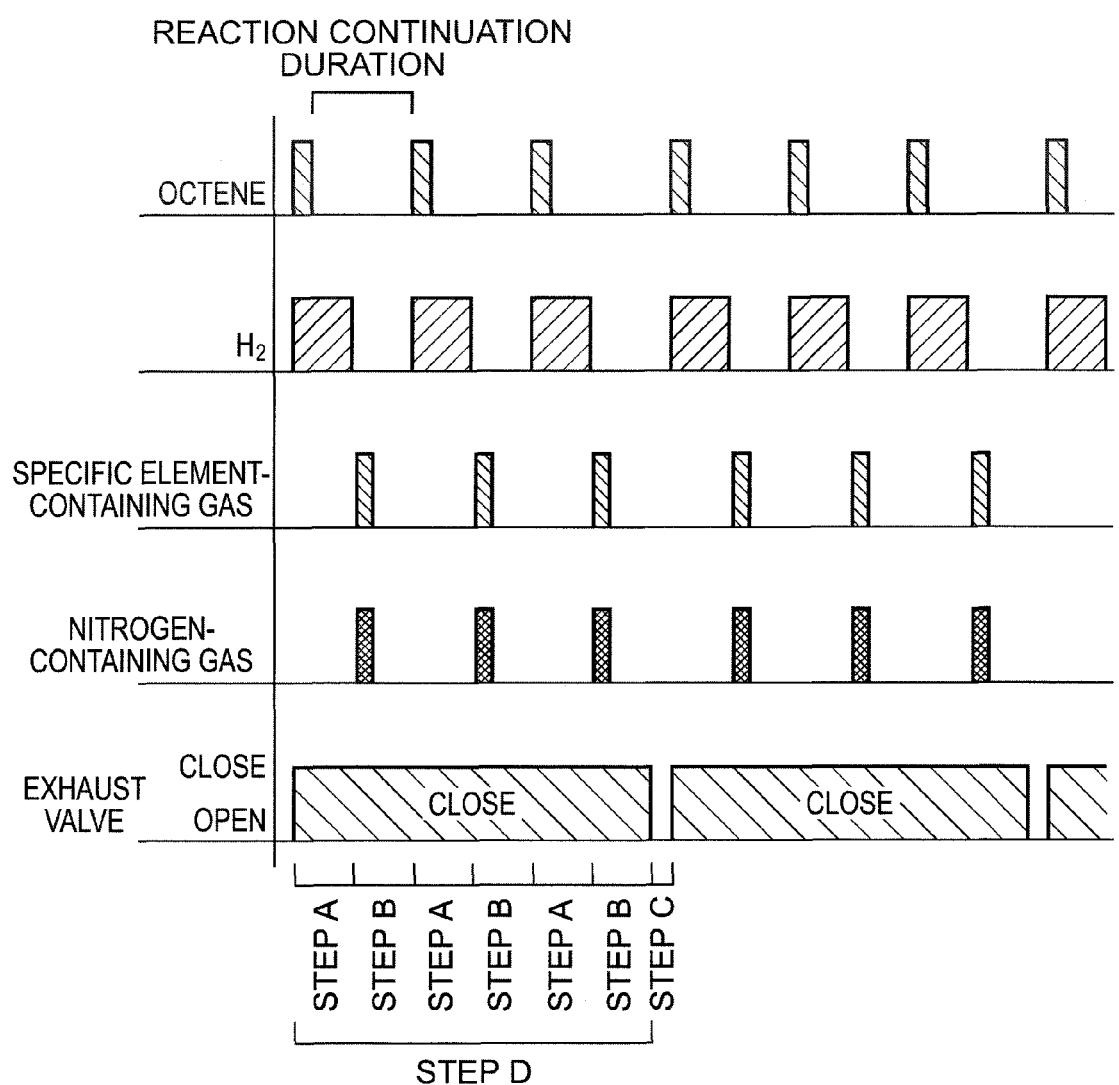
FIG. 8 is a diagram to explain yet another example of a film-forming sequence of an exemplary embodiment of the present invention.

Moreover, for example, a SiCN film can be formed as the carbon-based thin film by providing in step B, as illustrated in FIG. 8, a step of supplying a silicon-containing gas such as HCDS gas as the specific element-containing gas, and a step of supplying for example $NH_3$ as the nitrogen-containing gas. Note that the processing conditions when this is performed may for example be similar processing conditions to the processing conditions in the above exemplary embodiment.

The specific element-containing gas is supplied from the third gas supply pipe 232c into the processing chamber 201 through the mass flow controller 241c, the valve 243c and the third nozzle 249c.

The nitrogen-containing gas is supplied from the fourth gas supply pipe 232d into the processing chamber 201 through the mass flow controller 241d, the valve 243d, and the fourth nozzle 249d.

Note that a BCN film can be formed as the carbon-based thin film by providing a step of supplying a boron-containing gas such as for example $BCl_3$ gas as the specific element-containing gas in place of the silicon-containing gas, as illustrated in FIG. 8. Note that the processing conditions when this is performed may for example be similar processing conditions to the processing conditions in the above exemplary embodiment.

Moreover, an AlCN film, a TiCN film, a TaCN film, a MoCN film and a WCN film can be respectively formed as the carbon-based thin film by providing a step as illustrated in FIG. 8 of supplying an aluminum-containing gas, a titanium-containing gas, a tantalum-containing gas, a molybdenum-containing gas and a tungsten-containing gas, such as $AlCl_3$ gas, $TiCl_4$ gas, $TaCl_5$ gas, $MoCl_5$ gas and $WCl_6$ gas as the specific element-containing gas in place of the silicon-containing gas. Note that the processing conditions when this is performed may for example be similar processing conditions to the processing conditions in the above exemplary embodiment.

Note that in FIG. 8 the step of supplying the specific element-containing gas and the step of supplying the nitrogen-containing gas are performed at the same time as each other. However configuration may be made such that the step of supplying the specific element-containing gas may be performed prior to the step of supplying the nitrogen-containing gas, or the step of supplying the nitrogen-containing gas may be performed prior to the step of supplying the specific element-containing gas.

Note that in FIG. 7 and FIG. 8, explanation has been given of an example in which the steps for supplying the specific element-containing gas and the nitrogen-containing gas are performed during octene gas and $H_2$ gas supply stop duration, such as in step B. However configuration may be made such that the steps for supplying the specific element-containing gas and the nitrogen-containing gas are performed while supply of octene gas and $H_2$ gas continues, such as in step A.

Examples of hydrocarbon-based gases other than octene ($C_8H_{16}$) that can be preferably used as the organic-based gas include, for example, ethylene ($C_2H_4$), propene ($C_3H_6$), butene ($C_4H_8$), pentene ($C_5H_{10}$), hexene ($C_6H_{12}$), heptene ($C_7H_{14}$), and ethane ($C_2H_6$), propane ($C_3H_8$), butane ($C_4H_{10}$), pentane ($C_5H_{12}$), hexane ($C_6H_{14}$), heptane ($C_7H_{16}$) and octane ($C_8H_{18}$). Namely, as the organic-based gas, preferably use can be made of at least 1 type of source material from organic source materials such as $C_xH_{2x}$ or $C_xH_{2x+2}$ (wherein x is an integer greater than 1 (x>1)). These organic source materials are hydrocarbon source materials configured by only 2 elements, carbon (C) and hydrogen (H), and since they are source materials that do not contain chlorine (Cl) they may be referred to as no-chlorine-containing source materials. Organic source materials in such cases act as a carbon source during carbon-based thin film formation.

Note that the C-element array in a film becomes denser more readily the smaller the molecular size of the carbon source, namely the smaller the value taken by x in the above-mentioned chemical formulas. A dense array combines with an annealing effect to cause an a-C film to undertake localized crystal growth, leading to polycrystallization, and effectively increasing (worsening) surface roughness. This phenomenon is particularly pronounced with a carbon source of x≤4.

In tests of surface roughness (RMS value) using AFM analysis, about 0.6 nm is obtained when x=3 and about 0.35 nm is obtained when x=8. x and RMS values are correlated. Estimation from this correlation indicates that a carbon source with larger molecular size, namely x≥5, is a necessary condition to achieve RMS≤0.5 nm as a target value, and that RMS≤0.5 nm cannot be achieved when a carbon source of x≤4 is employed.

Moreover, a hydrocarbon-based carbon source has a lower decomposition temperature the larger the molecular size, and so there is a significant advantage in employing such a carbon source.

Due to the above it is preferable to employ as the carbon source at least a source material selected from $C_xH_{2x}$ or $C_xH_{2x+2}$ (wherein x is an integer greater than 4 (x>4), namely x is an integer of 5 or greater).

As a hydrogen-containing gas, apart from hydrogen ($H_2$) other gases that can be preferably employed include for example ammonia ($NH_3$) gas, and a hydrocarbon-based gas such as methane ($CH_4$) gas, ethylene ($C_2H_4$) or acetylene ($C_2H_2$) gas.

As a silicon-containing gas for the specific element-containing gas, other inorganic source materials apart from HCDS that can be preferably employed include for example tetrachlorosilane, namely silicon tetrachloride ($SiCl_4$, abbreviation: STC), trichlorosilane ($SiHCl_3$, abbreviation: TCS), dichlorosilane ($SiH_2Cl_2$, abbreviation: DCS), and monochlorosilane ($SiH_3Cl$, abbreviation: MCS).

Moreover, other than these, source materials that can be preferably employed as the silicon-containing gas include at least one source material selected from out of organosilane source materials such as $Si_2C_2H_{10}$, $SiC_2H_8$, $Si_2CH_8$, $SiC_3H_{10}$, $Si_3CH_{10}$, $SiC_4H_{12}$, $Si_2C_3H_{12}$, $Si_3C_2H_{12}$, $Si_4CH_{12}$, $SiC_2H_6$, $SiC_3H_8$, $Si_2C_2H_8$, $SiC_4H_{10}$, $Si_2C_3H_{10}$, and $Si_3C_2H_{10}$. These organic source materials are configured from only 3 elements, silicon (Si), carbon (C) and hydrogen (H), and do not contain chlorine (Cl) so may be referred to as no-chlorosilane-containing source materials. The organic source material in such cases acts as a carbon source and also acts as a silicon source during carbon-based thin film formation. Employing such organic source materials as the silicon-containing gas facilitates control in the direction that increases the carbon component proportion, namely the carbon density, forming the carbon-based thin film that contains silicon (a SiC film or a SiCN film) and enables a film with a comparatively large carbon content, namely a carbon rich film, to be formed.

As a boron-containing gas from the specific element-containing gases, other gases that may be preferably employed other than $BCl_3$ include inorganic source materials such as for example diborane ($B_2H_6$), n, n', n"-trimethyl borazine (abbreviation: TMB), n, n', n"-triethyl borazine (abbreviation: TEB), n, n', n"-tri-n-propyl borazine (abbreviation: TPB) and n, n', n"-triisopropyl borazine (abbreviation: TIPB), n, n', n"-tri-n-butyl borazine (abbreviation: TBB) and n, n', n"-tri-isobutyl borazine (abbreviation: TIBB), namely an organic borazine-based gas (an organic borazine-based source material). Organic borazine-based gases act also as a boron source when forming a carbon-based thin film containing boron (BCN film), and also act as a nitrogen source and a carbon source.

Out of specific element-containing gases, source materials that can be preferably employed as an aluminum-containing gas, a titanium-containing gas, a tantalum-containing gas, a molybdenum-containing gas, and a tungsten-containing gas include $AlCl_3$, $TiCl_4$, $TaCl_5$, $MoCl_5$, and $WCl_6$, and also for example, aluminum trifluoride ($AlF_3$), titanium tetra fluoride ($TiF_4$), tantalum pentafluoride ($TaF_5$), molybdenum pentafluoride ($MoF_5$), and tungsten hexafluoride ($WF_6$). Aluminum-containing gases, titanium-containing gases, tantalum-containing gases, molybdenum-containing gases, and tungsten-containing gases act respectively as an aluminum source, a titanium source, a tantalum source, a molybdenum source, and a tungsten source during formation of carbon-based thin film containing metals (such as an AlC film, a TiC film, a TaC film, a MoC film, a WC film, an AlCN film, a TiCN film, a TaCN film, a MoCN film, and a WCN film.

Gases that can be preferably used as a nitrogen-containing gas other than ammonia ($NH_3$) gas include for example diazene ($N_2H_2$) gas, hydrazine ($N_2H_4$) gas and $N_3H_8$ gas. Nitrogen-containing gases act as a nitrogen source during formation of a carbon-based thin film containing silicon (SiCN film), a carbon-based thin film containing boron (BCN film), or a carbon-based thin film containing a metal (such as an AlCN film, a TiCN film, a TaCN film, a MoCN film or a WCN film). Note that nitrogen ($N_2$) gas is not incorporated into a carbon-based thin film due to nitrogen ($N_2$) gas being an inert gas, and so is not included in the definition of a nitrogen source.

Moreover, an amine-based gas can also be used as a nitrogen-containing gas. Note that an amine-based gas is a gas containing an amine group. An amine-based gas is a gas that includes at least nitrogen (N), carbon (C), and hydrogen (H). Namely, an amine-based gas is also a nitrogen-containing gas, is also a carbon-containing gas, and is also a hydrogen-containing gas. An amine-based gas includes an amine, such as for example ethylamine, methylamine, propylamine, isopropylamine, butylamine and isobutylamine. Amine is employed here as a general term for a compound of a form in which a hydrogen atom of ammonia ($NH_3$) has been substituted by a hydrocarbon group, such as for example an alkyl group. Namely an amine includes a hydrocarbon group, such as an alkyl group. An amine-based gas can also be referred to as a substance configured from only the three elements of nitrogen (N), carbon (C), and hydrogen (H). Since it also does not include silicon (Si), it can also be referred to as a no-silicon-containing substance, and since it also does not include silicon or a metal, it can also be referred to as a no-silicon-containing and no-metal-containing substance. Moreover, since it also does not contain chlorine it can also be referred to as a no-chlorine-containing substance. Examples of gases that can be preferably employed as an amine-based gas include: ethylamine-based gases such as triethylamine (($C_2H_5)_3N$, abbreviation: TEA), diethylamine (($C_2H_5)_2NH$, abbreviation: DEA), and monoethyl amine (($C_2H_5NH_2$), abbreviation: MEA); methylamine-based gases such as trimethylamine (($CH_3)_3N$, abbreviation: TMA), dimethylamine (($CH_3)_2NH$, abbreviation: DMA), and monomethylamine (($CH_3NH_2$, abbreviation: MMA); propylamine-based gases such as tripropylamine (($C_3H_7)_3N$, abbreviation: TPA), dipropylamine (($C_3H_7)_2NH$, abbreviation: DPA), and monopropyl amine (($C_3H_7)_3NH_2$, abbreviation: MPA); and isopropylamine-based gases, such as triisopropyl amine (($CH_3)_2CH)_3N$, abbreviation: TIPA), diisopropylamine (($CH_3)_2CH)_2NH$, abbreviation: DIPA), monoisopropylamine (($CH_3)_2 CHNH_2$, abbreviation: MIPA); butylamine-based gas, such as tributylamine (($C_4H_9)_3N$, abbreviation: TBA), dibutyl amine (($C_4H_9)_2 NH$, abbreviation DBA), monobutyl amine (($C_4H_9)_3NH_2$, abbreviation: MBA); and isobutylamine-based gas, such as triiso butylamine ((($CH_3)_2CHCH_2)_3N$, abbreviation: TIBA), diisobutylamine ((($CH_3)_2CHCH_2)_2 NH$, abbreviation: DIBA), and monoisobutylamine (($CH_3)_2 CHCH_2NH_2$, abbreviation: MIBA). Namely, as an amine-based gas, at least one kind of gas can be preferably used from out of gases expressed by ($C_2H_5$) $_xNH_{3-x}$, ($CH_3$) $_xNH_{3-x}$, ($C_3H_7$) $_xNH_{3-x}$, ($C_4H_9$) $_xNH_{3-x}$, (($CH_3)_2$ CH) $_xNH_{3-x}$, (($CH_3)_2CHCH_2)_x NH_{3-x}$, (wherein in the formulae x is an integer of 1-3). An amine-based gas acts as both a nitrogen source and a carbon source during formation of for example a carbon-based thin film containing silicon (a SiCN film), a carbon-based thin film containing boron (a BCN film), or a carbon-based thin film containing a metal (such as an AlCN film, a TiCN film, a TaCN film, a MoCN film or a WCN film). Employing an amine-based gas as the nitrogen-containing gas facilitates control in the direction that increases the carbon component proportion, namely the carbon density, for forming the carbon-based thin film that contains silicon, the carbon-based thin film that contains boron or the carbon-based thin film that contains a metal, and enables a film with a comparatively large carbon content, namely a carbon rich film, to be formed.

Moreover, in the present exemplary embodiment, although explanation has been given of an example in which an a-C film is formed using octene gas and $H_2$ gas, the use of $H_2$ gas may be omitted. Namely, an a-C film can be formed by employing octene gas on its own. Moreover, an a-C film can also be formed by employing octene gas that has been diluted with an inert gas such as $N_2$ on its own.

Figure 11:
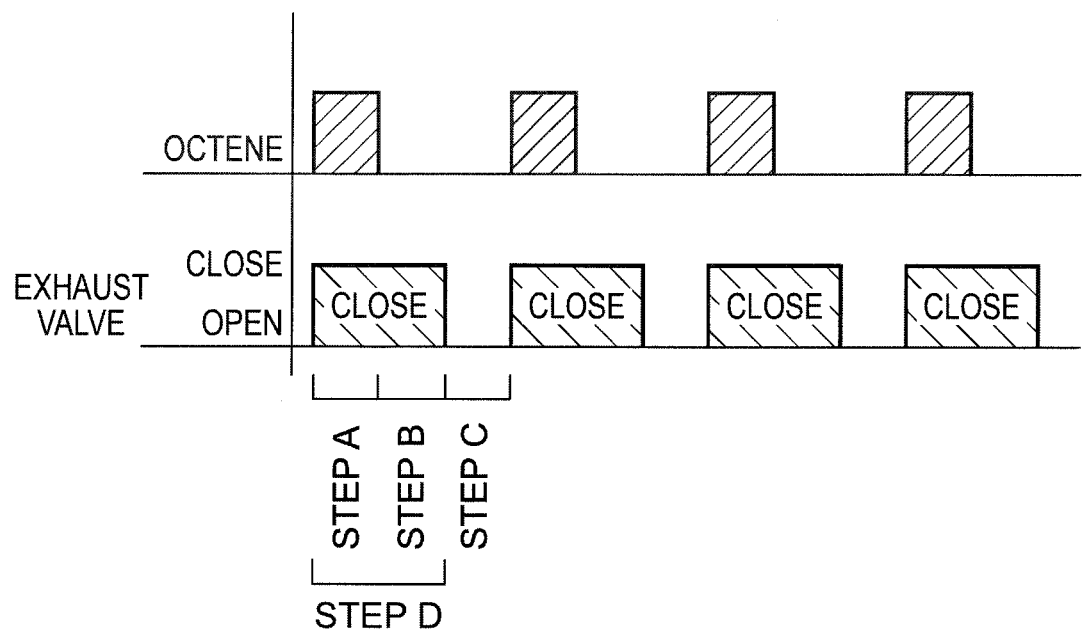
FIG. 11 is a diagram to explain yet another example of a film-forming sequence of an exemplary embodiment of the present invention.

For example, as illustrated in FIG. 11, an a-C film may be formed by executing a cycle including a step A, a step B and a step C a specific number of times, wherein step A supplies octene gas on its own, or octene gas that has been diluted with an inert gas on its own into a processing chamber and confined, step B maintains this state, and step C exhausts the processing chamber. Configuration may be made in such cases such that a cycle is executed a specific number of times, wherein the cycle is configured by a step (step D) of executing step A and step B a specific number of times and step C. The processing conditions when this is performed may be processing conditions similar to cases in which octene gas and $H_2$ gas are employed. Note that FIG. 11 illustrates an example in which the cycle, configured by the step of executing step A and step B a specific number of times (step D) and step C, is executed a specific number of times.

It has accordingly been confirmed that an a-C film can be formed that has a practical level of flatness, film thickness uniformity and step coverage even when use of $H_2$ gas is omitted and octene gas is used on its own, or octene gas that has been diluted with an inert gas is used on its own. However, use of octene gas and $H_2$ gas enables a a-C film with higher flatness, film thickness uniformity and step coverage to be formed, particularly when film-forming on deeper trenches and vias, namely on high aspect ratio trenches and vias.

Explanation has been given above of various typical exemplary embodiments of the present invention, however the present invention is not limited thereto.

For example, in the above exemplary embodiment, explanation has been given of an example in which supply of each of the gases is stopped in the step B, however configuration may be made such that an inert gas such as $N_2$ gas continuously flows in each of the nozzles during the step B. In such cases, the inert gas is supplied into the processing chamber, and the pressure inside the processing chamber rises. However, by controlling the flow rate of inert gas supplied into each of the nozzles, the pressure inside the processing chamber can be controlled so as not to exceed the processing pressure, namely a desired pressure in a range of 1000 to 20000 Pa. A film containing carbon can accordingly be prevented from forming inside each of the nozzles by making the inert gas flow continuously through each of the nozzles in step B.

Figure 12:
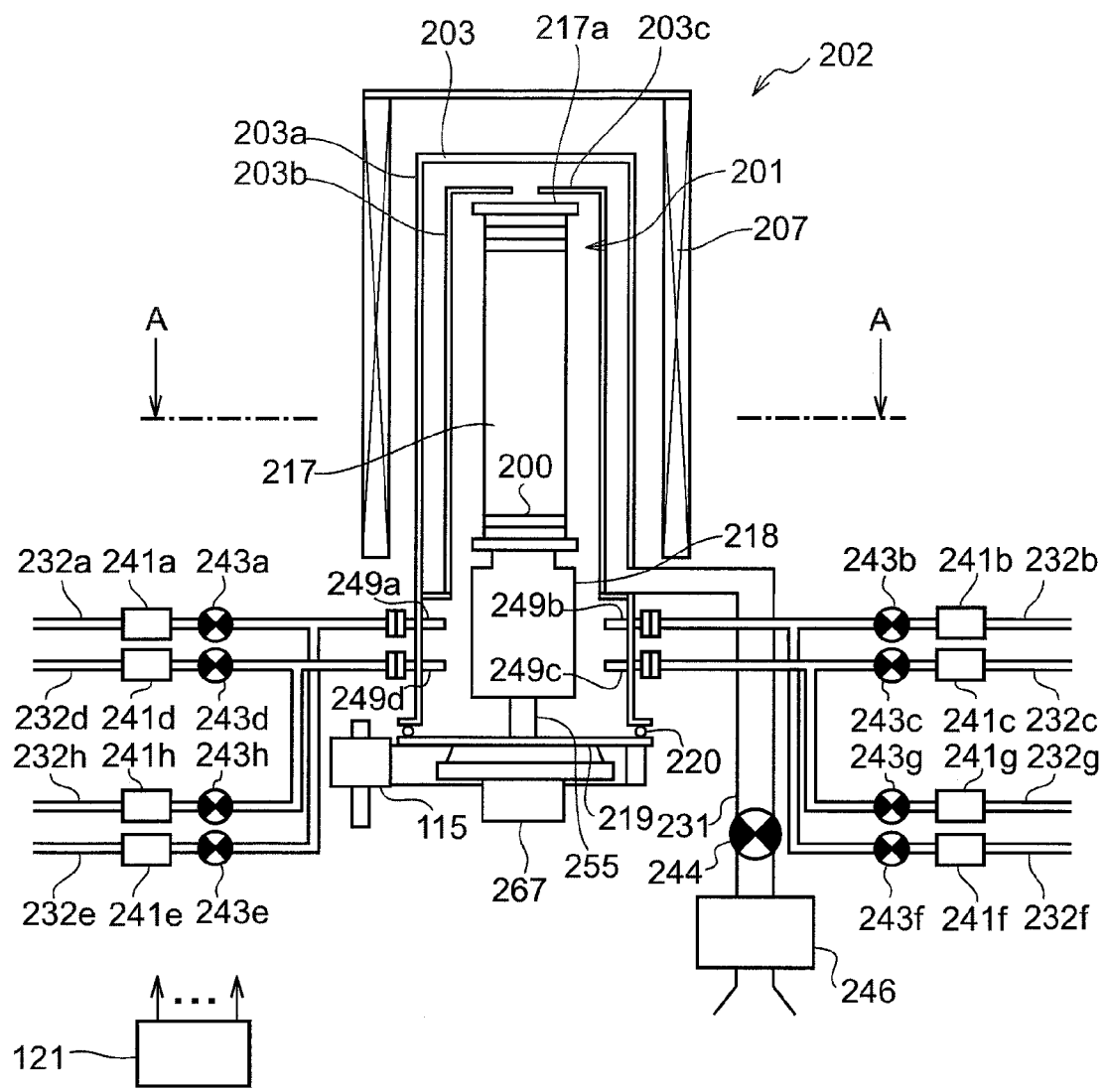
FIG. 12 is a schematic configuration diagram of a vertical processing furnace of another substrate processing apparatus preferably employed in an exemplary embodiment of the present invention, showing a processing furnace portion in vertical cross-section.

Moreover, for example, in the above exemplary embodiment, explanation has been given of an example in which the processing chamber 201 with a single-walled reaction tube structure is employed. However the present invention is not limited thereto and may also be appropriately applied to cases in which a double-walled reaction tube structure processing chamber 201 is employed. In such cases, as illustrated in FIG. 12, a reaction tube 203 is configured from an outer tube 203*a* serving as an external reaction tube and an inner tube 203*b* provided at the inside of the outer tube 203*a* and serving as an inner reaction tube. An organic-based gas, or an organic-based gas and a hydrogen-containing gas, are for example caused to flow inside a processing chamber 201 formed by a tube shaped hollow space inside the inner tube 203*b* from a lower end side of the inner tube 203*b* towards an upper end side thereof, then caused to flow out from the upper end side of the inner tube 203*b* and into a tube shaped space between the inner tube 203*b* and the outer tube 203*a*, then to flow downwards in a tube shaped space and be exhausted from an exhaust pipe 231. A confined state is also formed and maintained in such cases by adjusting the degree of openness of the APC valve 244 provided in the exhaust pipe 231 similarly to in the exemplary embodiment described above. Note that in FIG. 12, the same reference numerals have been appended to elements substantially the same as elements explained with respect to FIG. 1, and further explanation thereof is omitted.

It is accordingly possible to form an a-C film with superior flatness and film thickness uniformity by employing the processing chamber 201 of double-walled reaction tube structure.

Note that in such cases preferably an extension section 203*c* is provided to the upper end portion of the inner tube 203*b* so as to extend towards the inside, thereby achieving a structure in which at least a portion of an upper end face (top plate) 217*a* of the boat 217 is covered by the extension section 203*c*. The extension section 203*c* may be referred to as a structure that covers at least a portion of the main faces of the wafers 200. Moreover, the extension section 203*c* is preferably provided parallel to the upper end face 217*a* of the boat 217, namely parallel to the surfaces of the wafers 200.

The effective volume of the processing chamber 201 can be made smaller by thus providing the extension section 203*c* to an upper end portion of the inner tube 203*b* to achieve a structure in which at least a portion of the upper end face 217*a* of the boat 217 is covered by the extension section 203*c*. This enables the region where the organic-based gas thermally decomposes and a reaction species is generated to be reduced, and also enables generation of many reaction species to be suppressed. Moreover, the reaction species generated above the wafers 200, or between the outer tube 203*a* and the inner tube 203*b*, can be suppressed from contacting the wafers 200 due to the structure that covers above the wafers 200. Due to such a structure, the reaction species can be suppressed from having a detrimental effect on film thickness and film quality, enabling a uniform film thickness and film quality to be achieved both wafer in-plane and between wafers.

Figure 13:
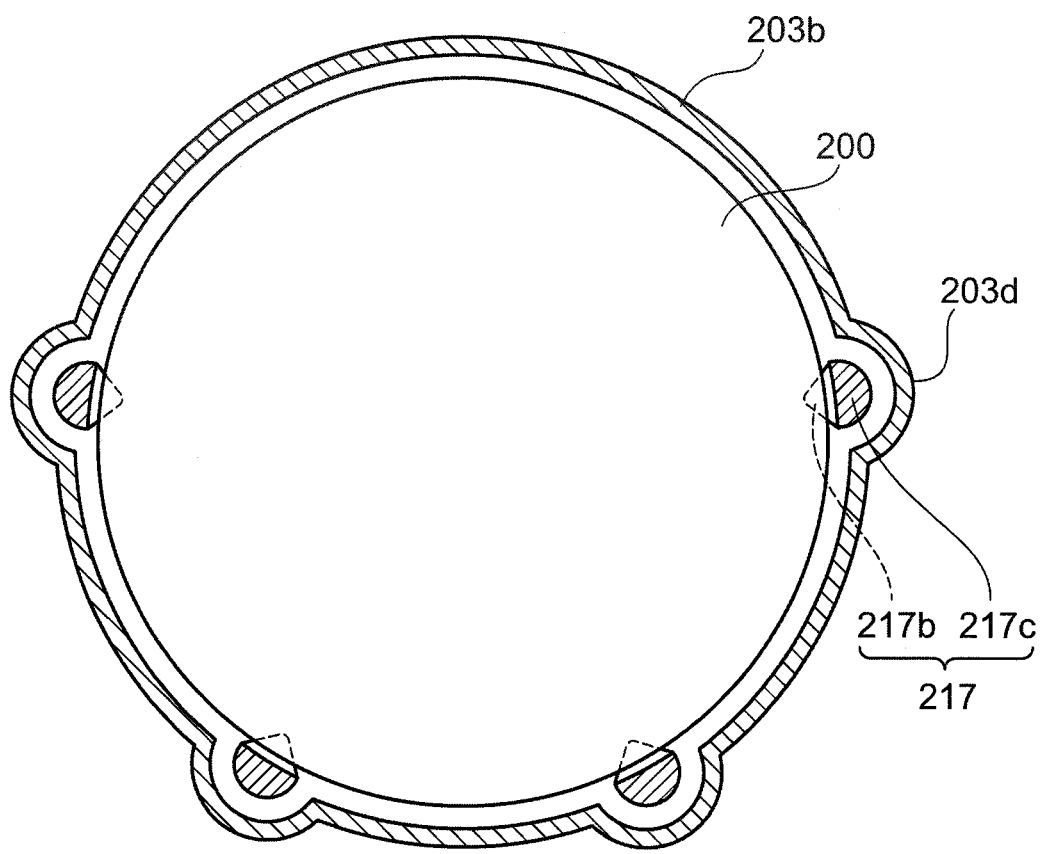
FIG. 13 is a schematic configuration diagram of a vertical processing furnace of another substrate processing apparatus preferably employed in an exemplary embodiment of the present invention, and is a partial cross-section showing a processing furnace portion in a cross-section taken along line A-A in FIG. 12, with only an inner tube, a boat and a wafer picked out for illustration.

Moreover, in such cases, the separation between the inner wall of the inner tube 203*b* and the edge portions of the wafers 200 is preferably set small. However, the boat 217 includes boat columns 217*c* provided with anchor grooves 217*b* that support the wafers 200, and the boat columns 217*c* are positioned further to the outside than the wafers 200. Consequently, when attempting to achieve a small separation between the inner wall of the inner tube 203*b* and the edge portions of the wafers 200, the inner wall of the inner tube 203*b* and the boat columns 217*c* make contact with each other, and so the separation between the inner wall of the inner tube 203*b* and the edge portions of the wafers 200 cannot be made any narrower. In other words, the boat columns 217*c* prevent the separation between the inner wall of the inner tube 203*b* and the edge portions of the wafers 200 from being made any smaller. Consequently, for example as illustrated in FIG. 13, in order to reduce the separation between the inner wall of the inner tube 203*b* and the edge portions of the wafers 200, preferably boat column grooves 203*d* are provided at portions of the inner wall of the inner tube 203*b* corresponding to the boat columns 217*c*, as spaces (indented portions) to accommodate portions of the boat columns 217*c*. Note that for simplicity only the inner tube 203*b*, the boat 217 and one of the wafers 200 are picked out for illustration in FIG. 13.

Due to such a structure, namely due to a structure in which the indented portions are provided to the inner wall of the inner tube 203*b* to accommodate the members configuring the boat 217, it is possible to make the separation between the inner wall of the inner tube 203*b* and the edge portions of the wafers 200 extremely small.

By thus making the separation between the inner wall of the inner tube 203*b* and the edge portions of the wafers 200 smaller, the effective volume of the processing chamber 201 can also be made small, and the region reduced where reaction species are generated, enabling generation of many reaction species to be suppressed. Due to this structure, the reaction species can accordingly be suppressed from detrimentally affecting the film thickness and film quality, thereby enabling uniform film thickness and film quality to be achieved both wafer in-plane and between wafers.

Moreover, in such cases the top face (the upper end face) of the outer tube 203*a* is preferably made a flat face. Moreover, this top face is also preferably provided parallel to the extension section 203*c* of the upper end portion of the inner tube 203*b*, namely parallel to the upper end face 217*a* of the boat 217, that is to say parallel to the main faces of the wafers 200. Note that in order to maintain the strength of the outer tube 203*a*, the thickness (wall thickness) of the top face of the outer tube 203 *a* is preferably made thicker than that of other portions, for example than the side wall portions of the outer tube 203*a*.

The effective volume of the processing chamber 201 can be made smaller by thus making the top face of the outer tube 203*a* a flat face, and the region where the reaction species are generated reduced, and moreover the generation of a variety of reaction species can be suppressed. Due to this structure, the reaction species can be suppressed from detrimentally affecting the film thickness and film quality, enabling uniform film thickness and film quality to be realized both wafer in-plane and between wafers.

Figure 14:
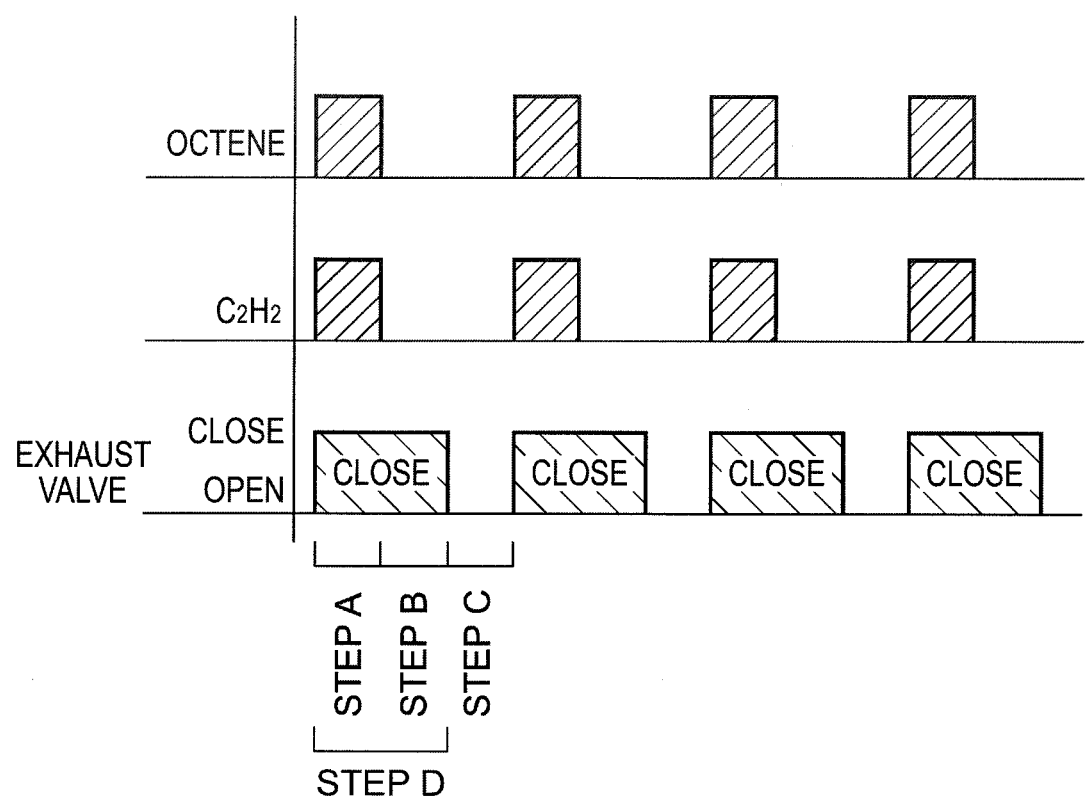
FIG. 14 is a diagram to explain yet another example of a film-forming sequence of an exemplary embodiment of the present invention.

In the above exemplary embodiment, explanation has been given of an example in which a carbon-based film such as an a-C film is formed by using octene gas and $H_2$ gas, however another carbon source different to octene gas may also be employed together with octene gas and $H_2$ gas. For example, octene gas, $H_2$ gas and $CH_4$ gas may be supplied into the processing chamber at the same time and confined inside. Moreover, for example, octene gas, $H_2$ gas and $C_2H_2$ gas may be supplied into the processing chamber at the same time and confined inside. Moreover, for example, octene gas, $H_2$ gas, $CH_4$ gas and $C_2H_2$ gas may be supplied into the processing chamber at the same time and confined inside. Moreover, $H_2$ gas may be omitted in such cases. For example, octene gas and $CH_4$ gas may be supplied into the processing chamber at the same time and confined inside. Moreover, for example, octene gas and $C_2H_2$ gas may be supplied into the processing chamber at the same time and confined inside. Moreover, for example, octene gas, $CH_4$ gas and $C_2H_2$ gas may be supplied into the processing chamber at the same time and confined inside. A carbon-based film can accordingly be formed by thus employing at least two different types of carbon source. Note that FIG. 14 illustrates an example in which octene gas and $C_2H_2$ gas are supplied into the processing chamber at the same time and confined inside.

Moreover, in the above exemplary embodiment, explanation has been given of an example in which a carbon-based film is formed in a non-plasma state, however the present invention is not limited thereto, and appropriate application may be made to forming a carbon-based film using plasma. In such cases, at least one of the organic-based gas and/or the hydrogen-containing gas is excited (activated) by a plasma. Excitation of at least one of the organic-based gas or the hydrogen-containing gas by a plasma may be performed by a direct plasma inside the processing chamber 201, or may be performed by a remote plasma outside of the processing chamber 201.

Moreover, in the above exemplary embodiment explanation has been given of examples in which carbon-based films are respectively formed mainly by 7 film-forming sequences, however the present invention is not limited thereto and appropriate combinations of these 7 film-forming sequences may be employed. For example, a combination may be employed of respective film-forming sequences of FIGS. 4, 5, 6, 11 and 14 and respective film-forming sequences of FIGS. 7 and 8.

Moreover, for example, although in the above exemplary embodiment explanation has been given of an example in which a ladder boat (a boat of a type provided with anchor grooves in boat columns) is employed as a substrate support jig that holds the substrates, the present invention is not limited thereto and appropriated application is also possible to cases employing a ring boat. In such cases, for example, the ring boat may be configured with 3 or 4 upright boat columns disposed at appropriate intervals in the circumferential direction, and with ring shaped holders serving as support plates that support the outer periphery of substrates attached horizontally at multiple levels to the boat columns so as to support the substrates from the back faces. In such cases, the ring shaped holders may be configured from ring shaped plates with outer diameters larger than the diameter of the substrates, and inner diameters smaller than the diameter of the substrates, and from plural substrate retention claws that are disposed on the ring shaped plates at appropriate intervals around the circumferential direction and retain the outer peripheral back face of the substrates. Moreover, in such cases, the ring shaped holder may be configured from ring shaped plates with outer diameters and inner diameters larger than the diameter of the substrates, and from plural substrate retention claws that retain the outer peripheral back face of the substrates disposed at the inside of the ring shaped plates at appropriate intervals around the circumferential direction. This approach has the advantage in comparison to case not provided with ring shaped plates in that the distance is shortened by the amount of ring shape plates from the holes of each of the nozzles to the region separated by each of the substrates (in this case the region divided between the ring shaped plates), thereby facilitating the passage of gas ejected from each of the nozzles across the substrate region. It is accordingly possible to maintain sufficient gas supply rate over the substrates, enabling a drop in film-forming speed and a deterioration in uniformity to be prevented. Use of a ring boat enables an a-C film to be formed with superior flatness and uniformity in film thickness.

Moreover, for example, although explanation has been given in the above exemplary embodiment of an example in which a thin film is film-formed using a batch-type substrate processing apparatus that processes plural substrates at one time, the present invention is not limited thereto. The present invention can also be appropriately applied to cases in which a thin film is film-formed using a sheet-fed substrate processing apparatus that processes single or plural substrates at one time. Moreover, although in the above exemplary embodiment explanation has been given of an example of thin film film-forming employing a substrate processing apparatus with a hot wall processing furnace, the present invention is not limited thereto, and the present invention can also be appropriately applied to cases in which a thin film is film-formed employing a substrate processing apparatus with a cold wall processing furnace.

Appropriate combinations may also be made from each of the exemplary embodiments, each of the modified examples and each of the application examples given above.

The present invention can also be realized for example by modifying a process recipe of an existing substrate processing apparatus. When modifying a process recipe, it is possible to install a process recipe according to the present invention in an existing substrate processing apparatus through an electronic communication line or through a non-transitory computer-readable recording medium recorded with the process recipe. It is also possible to operate an input-output device of an existing substrate processing apparatus and to modify the process recipe itself to the process recipe according to the present invention.

EXAMPLE 1

An a-C film was formed as an evaluation sample on wafers 200 using a film-forming sequence according to an exemplary embodiment of the present invention, as explained above with reference to FIG. 4. When this was performed, the temperature of the processing chamber 201 and the wafers 200 was set at 675° C., and the supply rates of materials, namely the supply flow rates of materials, and the supply durations were set respectively in the following manner for a 100 L volume processing chamber 201. Namely, the supply flow rate and supply duration of $H_2$ gas were respectively set at 2 slm, and 15 seconds, and the supply flow rate and supply duration of octene gas were respectively set at 10 slm and 10 seconds. Other processing conditions in each of step were conditions within the processing condition range described in the above exemplary embodiment. The surface state of the a-C film on the evaluation sample was then measured and observed using an Atomic Force Microscope (AFM).

Figure 9:
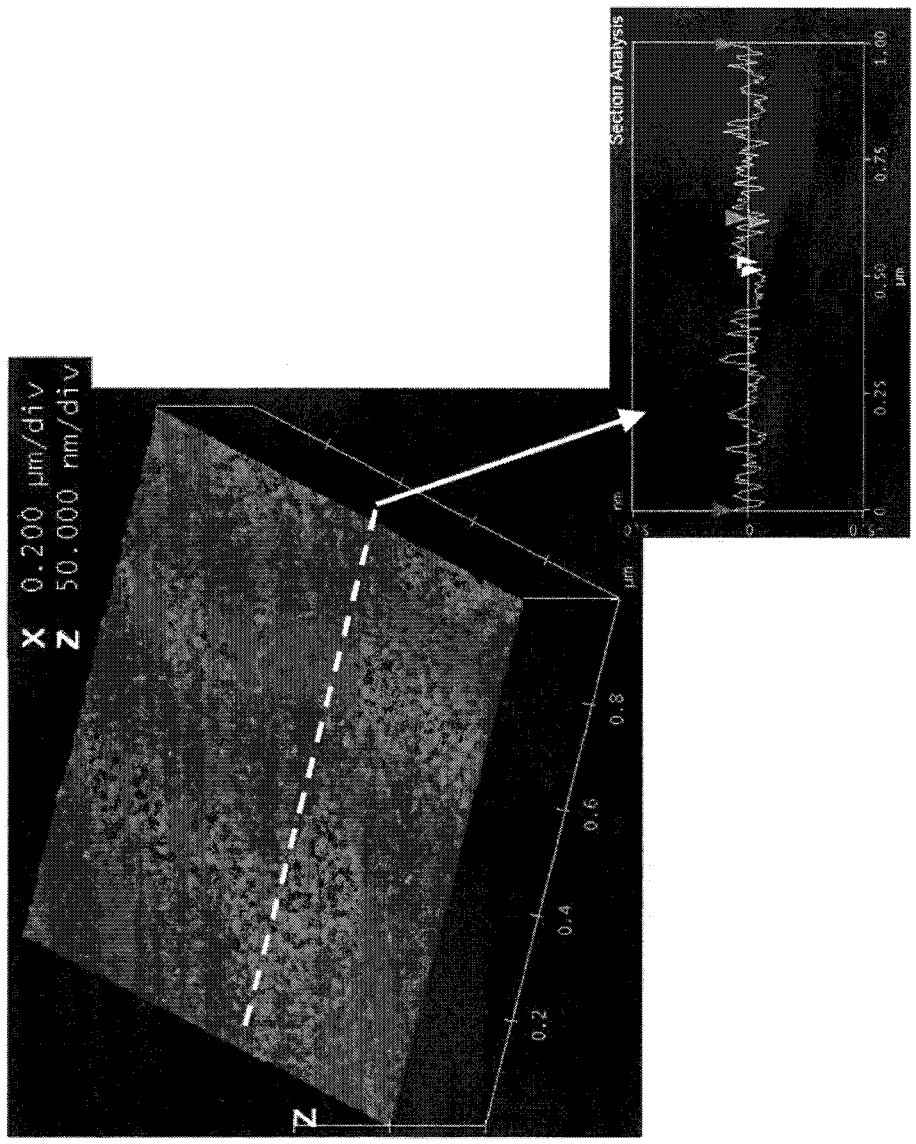
FIG. 9 is a diagram illustrating surface roughness of a carbon film formed in Example 1 of the present invention.

Results are illustrated in FIG. 9. FIG. 9 is a bird's eye view and cross-section illustrating a surface roughness state by AFM measurement over a 1 μm square of a-C film in the evaluation sample.

FIG. 9 shows that according to the present Example, a statistical value of the root-mean-square (RMS) of the height of undulations in the a-C film surface is 0.36 nm, confirming a surface state with smoothness below 0.5 nm.

EXAMPLE 2

An a-C film was formed as an evaluation sample on wafers 200 that have aspect ratios of about 5 on their surfaces using a film-forming sequence according to an exemplary embodiment of the present invention, as explained above with reference to FIG. 4. When this was performed processing conditions the same as those of Example 1 were employed. A cross-section of the a-C film on the evaluation sample was then observed with a Scanning Electron Microscope (SEM), and step coverage measured.

Figure 10:
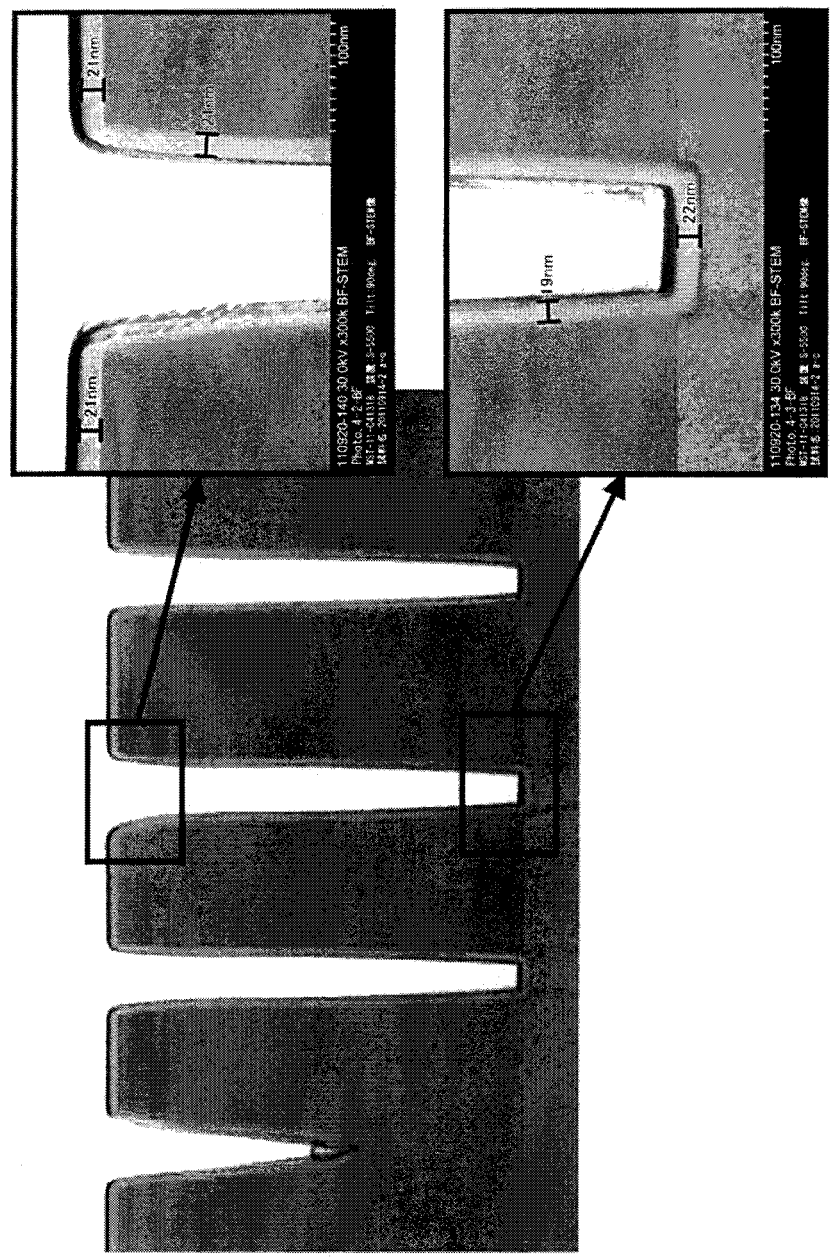
FIG. 10 is a diagram showing a cross-section SEM image of a carbon film formed in Example 2 of the present invention.

Results are illustrated in FIG. 10. It can be seen from FIG. 10 that according to the present Example, an a-C film was formed on the wafers 200 with surface trenches that had superior flatness and film thickness uniformity, and had high step coverage. The step coverage of the a-C film was about 95%. Note that in other tests that were performed by the present inventors it is confirmed that according to the film-forming sequence of an exemplary embodiment of the present invention, an a-C film can be formed with a step coverage of for example about 90% to 100%.

EXAMPLE 3

An a-C film was formed as an evaluation sample on wafers 200 by a film-forming sequence of an exemplary embodiment of the present invention, as explained with reference to FIG. 4. The processing conditions when this was performed were the same as the processing conditions of Example 1. A wafer etching evaluation was then performed on the a-C film of the evaluation sample using a 50% HF solution. Results confirm that a wafer etching resistance is obtained with a wafer etching rate of 1 Å/min or less.

(Preferred Aspects of the Present Invention)

Hereinafter, preferred aspects of the present invention will be added.

(Addition 1)

According to an aspect of the present invention, there is provided a method of manufacturing a semiconductor device including:

forming a film containing carbon on a substrate by repeating a cycle plural times, wherein the cycle includes:
  in a state in which a substrate housed in a processing chamber is heated, supplying an organic-based gas into the processing chamber and confining the organic-based gas inside the processing chamber;
  maintaining a state in which the organic-based gas is confined inside the processing chamber; and
  exhausting an inside of the processing chamber.

(Addition 2)

In the method according to Addition 1, preferably, in the forming of the film containing carbon, the substrate inside the processing chamber is heated to a temperature at which the organic-based gas thermally decomposes.

(Addition 3)

In the method according to Addition 1 or 2, preferably, the forming of the film containing carbon is performed in a non-plasma atmosphere.

(Addition 4)

In the method according to any one of Additions 1 to 3, preferably, the forming of the film containing carbon includes plural alternate repetitions of:
  alternately performing, a specific number of times, the confining of the organic-based gas inside the processing chamber, and the maintaining of the state in which the organic-based gas is confined inside the processing chamber; and
  exhausting the inside of the processing chamber.

Here, the "alternately performing, a specific number of times, (A) the confining of the organic-based gas inside the processing chamber, and (B) the maintaining of the state in which the organic-based gas is confined inside the processing chamber" includes, when (A) the confining of the organic-based gas inside the processing chamber, and (B) the maintaining of the state in which the organic-based gas is confined inside the processing chamber are set as one cycle, both of a case in which the cycle is performed one time and a case in which the cycle is performed plural times (is repeated plural times), that is, which means that the cycle is performed one or more times (one time or plural times).

(Addition 5)

In the method according to any one of Additions 1 to 3, preferably, in the forming of the film containing carbon, the confining of the organic-based gas inside the processing chamber, the maintaining of the state in which the organic-based gas is confined inside the processing chamber, and the exhausting of the inside of the processing chamber are set as one cycle, and the cycle is repeated plural times.

(Addition 6)

In the method according to any one of Additions 1 to 3, preferably, in the forming of the film containing carbon, the plural alternate repetitions of the confining of the organic-based gas inside the processing chamber and the maintaining of the state in which the organic-based gas is confined inside the processing chamber; and the exhausting of the inside of the processing chamber are set as one cycle, and the cycle is repeated plural times.

(Addition 7)

In the method according to any one of Additions 1 to 6, preferably, the exhausting of the inside of the processing chamber is stopped in at least one of the confining of the organic-based gas inside the processing chamber or the maintaining of the state in which the organic-based gas is confined inside the processing chamber.

(Addition 8)

In the method according to any one of Additions 1 to 6, preferably, in at least one of the confining of the organic-based gas inside the processing chamber or the maintaining the state in which the organic-based gas is confined inside the processing chamber, the exhausting of the inside of the processing chamber is performed while the organic-based gas is being supplied into the processing chamber, and at this time, a state is maintained in which an exhaustion rate of the organic-based gas from the inside of the processing chamber is lower than a supply rate of the organic-based gas into the processing chamber.

(Addition 9)

In the method according to any one of Additions 1 to 8, preferably,
in the confining of the organic-based gas inside the processing chamber, the organic-based gas and a hydrogen-containing gas are confined inside the processing chamber; and
in the maintaining of the state in which the organic-based gas is confined inside the processing chamber, a state is maintained in which the organic-based gas and the hydrogen-containing gas are confined inside the processing chamber.

(Addition 10)

In the method according to any one of Additions 1 to 9, preferably, the organic-based gas includes a hydrocarbon-based gas.

(Addition 11)

In the method according to any one of Additions 1 to 9, preferably, the organic-based gas includes a gas configured from two elements of carbon (C) and hydrogen (H) alone.

(Addition 12)

In the method according to any one of Additions 1 to 9, preferably, the organic-based gas includes at least one gas selected from the group consisting of $C_xH_{2x}$ and $C_xH_{2x+2}$ (wherein x is an integer greater than 4).

(Addition 13)

In the method according to any one of Additions 1 to 9, preferably, the organic-based gas includes at least one gas selected from the group consisting of butene ($C_4H_8$), pentene ($C_5H_{10}$), hexene ($C_6H_{12}$), heptene ($C_7H_{14}$), octene ($C_8H_{16}$), butane ($C_4H_{10}$), pentane ($C_5H_{12}$), hexane ($C_6H_{14}$), heptane ($C_7H_{16}$) and octane ($C_8H_{18}$).

(Addition 14)

In the method according to any one of Additions 1 to 9, preferably, the organic-based gas includes octane ($C_8H_{18}$).

(Addition 15)

In the method according to any one of Additions 1 to 14, preferably, in the forming of the film containing carbon, a temperature of the substrate is from 600° C. to 700° C.

(Addition 16)

In the method according to any one of Additions 1 to 14, preferably, the film containing carbon is a film configured from carbon alone.

(Addition 17)

In the method according to any one of Additions 1 to 15, preferably, the film containing carbon is an amorphous carbon film configured from carbon alone.

(Addition 18)

In the method according to any one of Additions 1 to 15, preferably, the forming of the film containing carbon further includes supplying a gas including a predetermined element, and a film containing the predetermined element and carbon is formed as the film containing carbon.

(Addition 19)

In the method according to any one of Additions 1 to 15, preferably, the forming of the film containing carbon further includes supplying a gas including a predetermined element and supplying a gas including nitrogen, and a film containing the predetermined element, carbon and nitrogen is formed as the film containing carbon.

(Addition 20)

According to another aspect of the present invention, there is provided a method of processing a substrate including:

forming a film containing carbon on a substrate by repeating a cycle plural times, wherein the cycle includes:

in a state in which a substrate housed in a processing chamber is heated, supplying an organic-based gas into the processing chamber and confining the organic-based gas inside the processing chamber;

maintaining a state in which the organic-based gas is confined inside the processing chamber; and exhausting an inside of the processing chamber.

(Addition 21)

According to still another aspect of the present invention, there is provided a substrate processing apparatus comprising:

a processing chamber configured to house a substrate;

a heater configured to heat the substrate inside the processing chamber;

an organic-based gas supply system configured to supply an organic-based gas into the processing chamber;

an exhaust system configured to exhaust an inside of the processing chamber; and a controller configured to control the heater, the organic-based gas supply system and the exhaust system such that a film containing carbon is formed on the substrate by repeating a cycle plural times, the cycle including: in a state in which the substrate housed in the processing chamber is heated, supplying an organic-based gas into the processing chamber and confining the organic-based gas inside the processing chamber, maintaining a state in which the organic-based gas is confined inside the processing chamber, and exhausting the inside of the processing chamber.

(Addition 22)

According to still another aspect of the present invention, there is provided a program that causes a computer to perform a process including: forming a film containing carbon on a substrate by repeating a cycle plural times, wherein the cycle includes:

in a state in which a substrate housed in a processing chamber is heated, supplying an organic-based gas into the processing chamber and confining the organic-based gas inside the processing chamber;

maintaining a state in which the organic-based gas is confined inside the processing chamber, and exhausting an inside of the processing chamber.

(Addition 23)

According to still another aspect of the present invention, there is provided a non-transitory computer-readable recording medium storing a program that causes a computer to perform a process including: forming a film containing carbon on a substrate by repeating a cycle plural times, wherein the cycle includes:

in a state in which a substrate housed in a processing chamber is heated, supplying an organic-based gas into the processing chamber and confining the organic-based gas inside the processing chamber;

maintaining a state in which the organic-based gas is confined inside the processing chamber, and exhausting an inside of the processing chamber.

As stated above, although various typical embodiments of the present invention have been described, the present invention is not limited to these embodiments. Therefore, the invention is intended to be limited only by the appended claims.

What is claimed is:

1. A method of manufacturing a semiconductor device comprising:

forming a film containing carbon on a substrate by repeating a cycle a plurality of times, wherein the cycle includes:

in a state in which a substrate housed in a processing chamber is heated, supplying an organic-based gas into the processing chamber and confining the organic-based gas inside the processing chamber, wherein the organic-based gas includes at least one gas selected from the group consisting of $C_xH_{2x}$ and $C_xH_{2x+2}$, wherein x is an integer greater than 4;

maintaining a state in which the organic-based gas is confined inside the processing chamber; and exhausting an inside of the processing chamber, wherein the film containing carbon is a film configured from carbon alone.

2. The method according to claim 1, wherein in the forming of the film containing carbon, the substrate inside the processing chamber is heated to a temperature at which the organic-based gas thermally decomposes.

3. The method according to claim 1, wherein the forming of the film containing carbon is performed in a non-plasma atmosphere.

4. The method according to claim 1, wherein the forming of the film containing carbon includes a plurality of alternate repetitions of:

alternately performing, a specific number of times, the confining of the organic-based gas inside the processing chamber, and the maintaining of the state in which the organic-based gas is confined inside the processing chamber; and exhausting the inside of the processing chamber.

5. The method according to claim 1, wherein in the forming of the film containing carbon, the confining of the organic-based gas inside the processing chamber, the maintaining of the state in which the organic-based gas is confined inside the processing chamber, and the exhausting of the inside of the processing chamber are set as one cycle, and the cycle is repeated a plurality of times.

6. The method according to claim 1, wherein in the forming of the film containing carbon, a plurality of alternate repetitions of the confining of the organic-based gas inside the processing chamber and the maintaining of the state in which the organic-based gas is confined inside the processing chamber, and one repetition of the exhausting of the inside of the processing chamber, are set as one cycle, and the cycle is repeated a plurality of times.

7. The method according to claim 1, wherein the exhausting of the inside of the processing chamber is stopped in at least one of the confining of the organic-based gas inside the processing chamber or the maintaining of the state in which the organic-based gas is confined inside the processing chamber.

8. The method according to claim 1, wherein in at least one of the confining of the organic-based gas inside the processing chamber or the maintaining the state in which the organic-based gas is confined inside the processing chamber, the exhausting of the inside of the processing chamber is performed while the organic-based gas is being supplied into the processing chamber, and at this time, a state is maintained in which an exhaustion rate of the organic-based gas from the inside of the processing chamber is lower than a supply rate of the organic-based gas into the processing chamber.

9. The method according to claim 1, wherein:
in the confining of the organic-based gas inside the processing chamber, the organic-based gas and a hydrogen-containing gas are confined inside the processing chamber; and
in the maintaining of the state in which the organic-based gas is confined inside the processing chamber, a state is maintained in which the organic-based gas and the hydrogen-containing gas are confined inside the processing chamber.

10. The method according to claim 1, wherein the film containing carbon is an amorphous carbon film.

11. A method of manufacturing a semiconductor device comprising:
forming a film containing carbon on a substrate by repeating a cycle a plurality of times, wherein the cycle includes:
in a state in which a substrate housed in a processing chamber is heated, supplying an organic-based gas into the processing chamber and confining the organic-based gas inside the processing chamber;
maintaining a state in which the organic-based gas is confined inside the processing chamber; and
exhausting an inside of the processing chamber,
wherein the organic-based gas includes at least one gas selected from the group consisting of butene ($C_4H_8$), pentene ($C_5H_{10}$), hexene ($C_6H_{12}$), heptene ($C_7H_{14}$), octene ($C_8H_{16}$), pentane ($C_5H_{10}$), hexane ($C_6H_{14}$), heptane ($C_7H_{16}$) and octane ($C_8H_{18}$), and
wherein the film containing carbon is a film configured from carbon alone.

12. The method according to claim 1, wherein in the forming of the film containing carbon, a temperature of the substrate is from 600° C. to 700° C.

13. A method of manufacturing a semiconductor device comprising:
forming a film containing carbon on a substrate by repeating a cycle a plurality of times, wherein the cycle includes:
in a state in which a substrate housed in a processing chamber is heated, supplying an organic-based gas into the processing chamber and confining the organic-based gas inside the processing chamber;
maintaining a state in which the organic-based gas is confined inside the processing chamber; and
exhausting an inside of the processing chamber,
wherein the film containing carbon is a film configured from carbon alone.

14. The method according to claim 13, wherein the film containing carbon is an amorphous carbon film.

15. A method of processing a substrate comprising:
forming a film containing carbon on a substrate by repeating a cycle a plurality of times, wherein the cycle includes:
in a state in which a substrate housed in a processing chamber is heated, supplying an organic-based gas into the processing chamber and confining the organic-based gas inside the processing chamber, wherein the organic-based gas includes at least one gas selected from the group consisting of $C_xH_{2x}$ and $C_xH_{2x+2}$, wherein x is an integer greater than 4;
maintaining a state in which the organic-based gas is confined inside the processing chamber; and
exhausting an inside of the processing chamber,
wherein the film containing carbon is a film configured from carbon alone.

* * * * *